(12) United States Patent
Higuchi

(10) Patent No.: US 9,026,833 B2
(45) Date of Patent: May 5, 2015

(54) SEMICONDUCTOR DEVICE AND METHOD FOR FETCHING DATA

(75) Inventor: Yuki Higuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 494 days.

(21) Appl. No.: 13/408,280

(22) Filed: Feb. 29, 2012

(65) Prior Publication Data

US 2012/0223768 A1  Sep. 6, 2012

(30) Foreign Application Priority Data

Mar. 1, 2011  (JP) ................................. 2011-043717

(51) Int. Cl.
| | | |
|---|---|---|
| G06F 1/04 | (2006.01) | |
| G06F 1/12 | (2006.01) | |
| G06F 5/06 | (2006.01) | |
| H03K 5/04 | (2006.01) | |
| H03K 7/08 | (2006.01) | |
| H03K 5/00 | (2006.01) | |

(52) U.S. Cl.
CPC .. *H03K 5/04* (2013.01); *H03K 7/08* (2013.01); *H03K 2005/00293* (2013.01)

(58) Field of Classification Search
USPC .................... 713/600; 365/191, 193, 194, 195
See application file for complete search history.

(56) References Cited

U.S. PATENT DOCUMENTS

| | | | | |
|---|---|---|---|---|
| 6,201,743 | B1 * | 3/2001 | Kuroki ........................ | 365/194 |
| 2002/0074609 | A1 * | 6/2002 | Maruyama ................... | 257/390 |
| 2003/0179020 | A1 * | 9/2003 | Yoshida et al. .............. | 327/108 |
| 2006/0279340 | A1 * | 12/2006 | Toyoshima .................. | 327/112 |

FOREIGN PATENT DOCUMENTS

| | | | |
|---|---|---|---|
| JP | 2000-004147 | | 1/2000 |
| JP | 2000-163173 | | 6/2000 |
| JP | 2003-273715 | A * | 3/2002 |

\* cited by examiner

*Primary Examiner* — Zahid Choudhury

(74) *Attorney, Agent, or Firm* — Young & Thompson

(57) ABSTRACT

In order to reduce occurrence of a fetching error of a digital signal, caused by a power-source noise, there is provided a semiconductor device provided with a switching circuit for executing a switching operation according to a pulse control signal and a digital signal hold circuit for fetching a digital signal. The digital signal hold circuit includes a mask signal generation circuit for generating a mask signal from the pulse control signal, the mask signal being for use in keeping the digital signal from being fetched during a time period of power-source noise occurrence caused by the switching operation, and the digital signal is not fetched during the time period of power-source noise occurrence while the digital signal is fetched during a time period of power-source noise nonoccurrence.

19 Claims, 17 Drawing Sheets

SEMICONDUCTOR DEVICE AND METHOD FOR FETCHING DATA

CROSS-REFERENCE TO RELATED APPLICATIONS

The disclosure of Japanese Patent Application No. 2011-43717 filed on Mar. 1, 2011 including the specification, drawings, and abstract is incorporated herein by reference in its entirety.

BACKGROUND

The present invention relates to a semiconductor device, and a method for fetching data, and in particular, to a semiconductor device including a switching circuit for repeating periodical ON/OFF, and a method for fetching data thereof.

In order to meet requirements for miniaturization of a semiconductor device, lower power consumption, and so forth, a power source making use of the switching circuit for repeating periodical ON/OFF, the so-called switching power source, has lately been in heavy use. For example, a dc-to-dc (DCDC) converter, and so forth are well known, the DCDC converter making use of a pulse width modulation (PWM) control for adjusting a duty ratio of a pulse signal inputted to the switching circuit.

With the use of the DCDC converter described as above, a supply voltage can be controlled according to an operation state of, for example, an electronic device. Further, such a DCDC converter as described, serving as a power management IC (PMIC: Power Management Integrated Circuit) can be formed in a chip to be mounted in a variety of electronic devices in order to reduce power consumption. Further, a similar switching technology is adopted in a class-D amp for driving a speaker in various electronic devices.

On the other hand, with the switching circuit, there occurs a power-source noise accompanying ON/OFF of a switch. Accordingly, countermeasures for preventing a malfunction caused by the power-source noise will be required. Needless to say, with the switching circuit, strenuous efforts have been underway in order to reduce the power-source noise by use of various noise filters and a decoupling capacitor. However, results have been unsatisfactory.

In Japanese Unexamined Patent Publication No. 2000-004147, there is disclosed a technology for removing a glitch noise contained in an asynchronous signal by use of an input circuit. Further, in Japanese Unexamined Patent Publication No. 2000-163173, there is disclosed a technology for reducing noise by staggering respective output timing of a signal and noise because the noise will increase if the signal and the noise are concurrently outputted from an output buffer of a digital circuit.

SUMMARY

The inventors have found out the following problem. In the case where a digital signal is inputted to a semiconductor device with a switching circuit mounted therein, the digital signal is fetched by a signal holding circuit such as a latch circuit, and so forth. It has been found out that if fetching timing of the digital signal coincidentally agrees with generation timing of the power-source noise at that point in time, an erroneous signal will be fetched (a fetching error), whereupon malfunction occurs.

In accordance with a first aspect of the invention, there is provided a semiconductor device including a switching circuit for executing a switching operation according to a pulse control signal, and a digital signal hold circuit for fetching a digital signal. The digital signal hold circuit includes a mask signal generation circuit for generating a mask signal from the pulse control signal, the mask signal being for use in keeping the digital signal from being fetched during a time period of power-source noise occurrence caused by the switching operation, and the digital signal is not fetched during the time period of power-source noise occurrence while the digital signal is fetched during a time period of power-source noise nonoccurrence.

In accordance with a second aspect of the invention, there is provided a semiconductor device semiconductor device including a microcomputer for generating a digital signal corresponding to an operation state of the microcomputer itself, and a DCDC converter for executing a switching operation corresponding to a pulse control signal, a duty ratio thereof being adjusted on the basis of the digital signal, thereby generating a voltage to be supplied to the microcomputer. The DCDC converter does not fetch the digital signal on the basis of the pulse control signal during a time period of power-source noise occurrence caused by the switching operation while it fetches the digital signal during a time period of power-source noise nonoccurrence.

The invention in its third aspect provides a method for fetching data of a semiconductor device provided with a switching circuit for executing a switching operation according to a pulse control signal. The method includes the steps of generating a mask signal from the pulse control signal, the mask signal being for use in keeping a digital signal from being fetched during a time period of power-source noise occurrence caused by the switching operation, and fetching the digital signal during a time period of power-source noise nonoccurrence without fetching the digital signal during the time period of power-source noise occurrence.

With the present invention, the digital signal is not fetched on the basis of the pulse control signal during the time period of power-source noise occurrence caused by the switching operation while the digital signal is fetching during the time period of power-source noise nonoccurrence. Hence, it is possible to reduce occurrence of a fetching error of the digital signal, caused by a power-source noise.

Thus, the invention can provide a semiconductor device implementing reduction in the occurrence a fetching error of a digital signal, caused by a power-source noise.

DETAILED DESCRIPTION OF THE PREFERRED EMBODIMENTS

There are described in detail specific embodiments of the invention hereinafter with reference to the accompanying drawings. However, it is to be understood that the invention is not limited to the embodiments described hereunder. Further, for the sake of clarity, description given hereunder and drawings are simplified where appropriate.

First Embodiment

Figure 1:
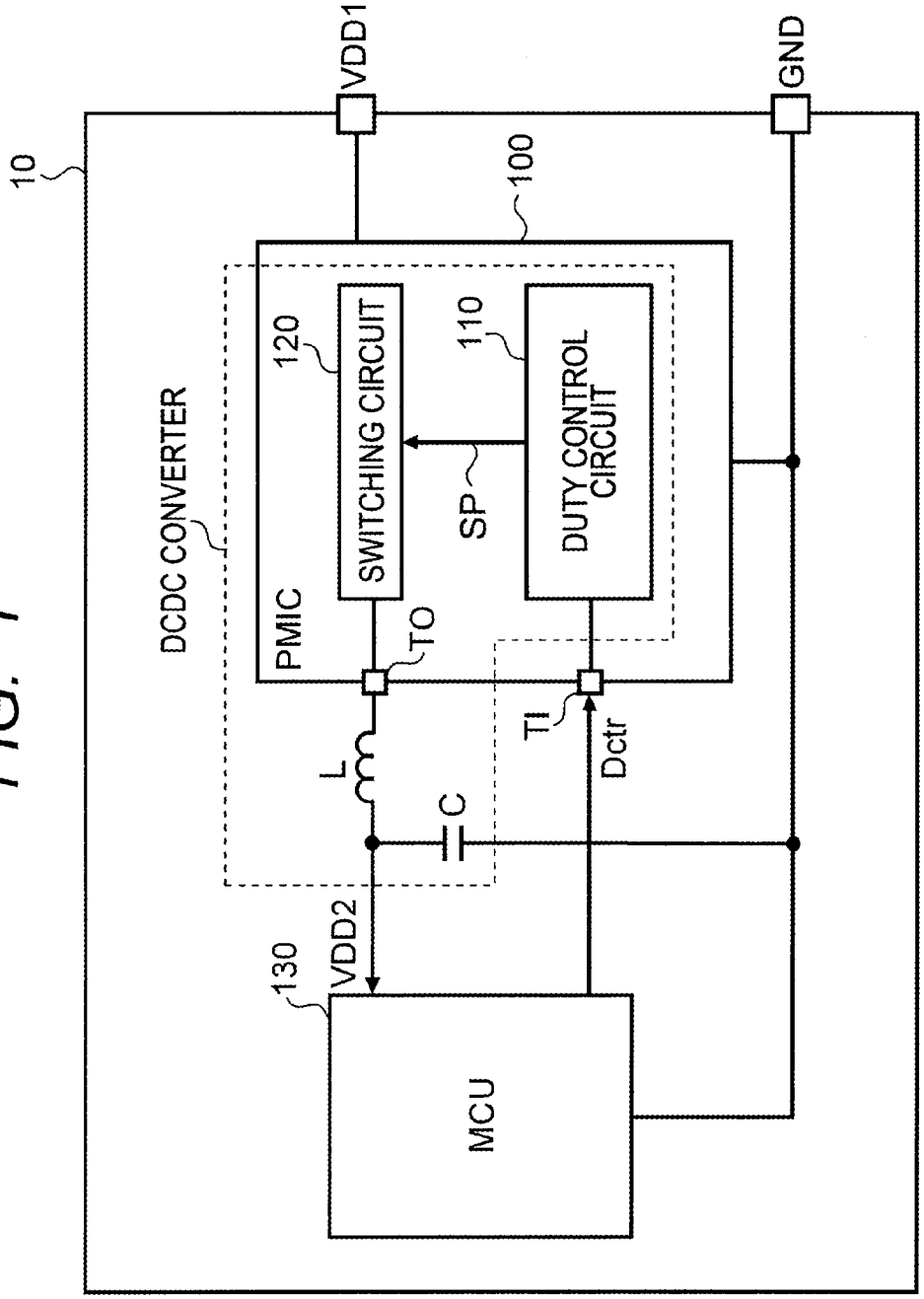
FIG. 1 is a block diagram of a circuit board in which a semiconductor device according to a first embodiment of the invention is mounted.

There is described hereinafter a semiconductor device according to a first embodiment of the invention with reference to FIGS. 1, and 2. FIG. 1 is a block diagram of a circuit board where the semiconductor device according to the first embodiment is mounted.

As shown in FIG. 1, a circuit board 10 is provided with a power management integrated circuit (PMIC) 100 as the semiconductor device according to the first embodiment of the invention, a micro control unit (MCU) 130, a coil L, and a capacitor C. The PMIC 100 is provided with a duty control circuit 110 and a switching circuit 120.

Further, the circuit board 10 is provided with a power-source terminal and a ground terminal. A power supply voltage VDD1 is applied to the power-source terminal, and a ground voltage GND is applied to the ground terminal. As shown in FIG. 1, the power supply voltage VDD1 and the ground voltage GND are applied to the PMIC 100 via respective interconnects. The PMIC 100, the coil L, and the capacitor C make up a DCDC converter, and the DCDC converter generates a power supply voltage VDD2 from the power supply voltage VDD1, the power supply voltage VDD2 being supplied to the MCU 130.

The duty control circuit 110 controls a duty ratio of a switching pulse signal SP outputted on the basis of a digital control signal Dctr outputted from the MCU 130 to be inputted to an input terminal TI of the PMIC 100. The switching circuit 120 outputs an output pulse signal that is the switching pulse signal SP inputted thereto to be then buffered. The duty control circuit 110 and the switching circuit 120, provided in the PMIC 100, are described in detail later on.

The output pulse signal outputted from the switching circuit 120 is smoothed by an LC filter made up of the coil L, and the capacitor C. By so doing, the power supply voltage VDD2 is generated. The power supply voltage VDD2 generated by the DCDC converter, and the ground voltage GND are applied to the MCU 130 via respective interconnects. The MCU 130 generates a digital control signal Dctr according to, for example, an operation state thereof to output the same to the PMIC 100. The MCU 130 is described in detail later on.

Figure 2:
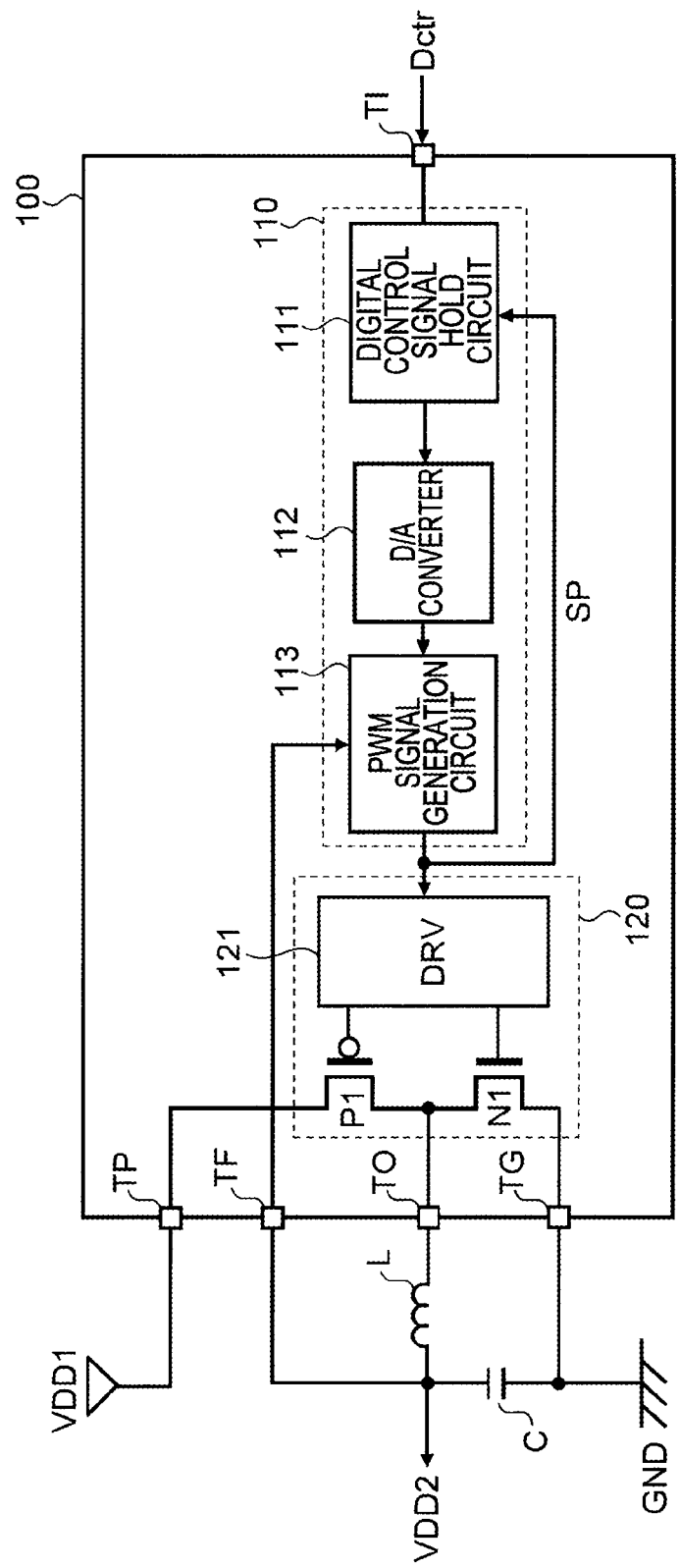
FIG. 2 is a block diagram of the semiconductor device according to the first embodiment of the invention.

FIG. 2 is a block diagram of the PMIC 100 that is the semiconductor device according to the first embodiment. As described above, and as shown in FIG. 2, the PMIC 100 is provided with the duty control circuit 110 and the switching circuit 120. The duty control circuit 110 is provided with a digital control signal hold circuit 111, a D/A converter (DAC: Digital to Analog Converter) 112, and a PWM signal generation circuit 113. Further, the switching circuit 120 is provided with a drive circuit 121, a PMOS transistor P1, and an NMOS transistor N1.

The digital control signal hold circuit 111 holds the digital control signal Dctr inputted via the input terminal TI of the PMIC 100. Further, the switching pulse signal SP outputted from the PWM signal generation circuit 113 is fed back to the digital control signal hold circuit 111.

At this point in time, an output pulse signal is generated from the switching pulse signal SP, whereupon there occurs a power-source noise caused by the output pulse signal. For this reason, the digital control signal hold circuit 111 is able to find out generation timing of the power-source noise on the basis of the switching pulse signal SP that is inputted. More specifically, the power-source noise occurs immediately after a signal transition ("rising", or "falling") of the output pulse signal on a transition-by-transition basis.

Accordingly, the digital control signal hold circuit 111 does not fetch the digital control signal Dctr for a predetermined time period in order to prevent occurrence of a fetching error, caused by the power-source noise. That is, the digital control signal hold circuit 111 fetches the digital control signal Dctr during a time period unaffected by power-source noise (a power-source noise nonoccurrence time period) before outputting the same. The digital control signal hold circuit 111 includes a logic circuit and a register, as described in detail later on.

The DAC 112 converts a digital control signal outputted from the digital control signal hold circuit 111 into an analog signal. The PWM signal generation circuit 113 controls a duty ratio of the switching pulse signal (a PWM signal) SP outputted on the basis of the analog signal outputted from the DAC 112 and the power supply voltage VDD2 fed back from an output side via a feedback terminal TF.

The drive circuit 121 outputs a drive pulse to respective gates of the PMOS transistor P1 and the NMOS transistor N1 according to the switching pulse signal SP outputted from the PWM signal generation circuit 113.

The PMOS transistor P1 and the NMOS transistor N1 make up an inverter. More specifically, the PMOS transistor P1 has a source coupled to a power source (the power supply voltage VDD1) via the power source terminal TP. The PMOS transistor P1 has a drain coupled to a drain of the NMOS transistor N1. The NMOS transistor N1 has a source coupled to a ground (the ground voltage GND) via the ground terminal TG. Respective gates of the PMOS transistor P1 and the NMOS transistor N1 are coupled to the drive circuit 121.

Upon the drive pulse being inputted to the respective gates of the PMOS transistor P1 and the NMOS transistor N1, the PMOS transistor P1 and the NMOS transistor N1 each complementarily repeat ON/OFF. By so doing, the output pulse signal is outputted from an output node to which the respective drains of the PMOS transistor P1 and the NMOS transistor N1 are coupled. This output pulse signal is outputted from the PMIC 100 via an output terminal TO.

An end of the coil L is coupled to the output terminal TO. The other end of the coil L is coupled to an end of the capacitor C. The other end of the capacitor C is coupled to the ground (the ground voltage GND). The coil L and the capacitor C make up the LC filter, as previously described. The power supply voltage VDD2 as an output of the DCDC converter made up of the PMIC 100, the coil L, and the capacitor C is outputted from a node between the coil L and the capacitor C.

Figure 3:
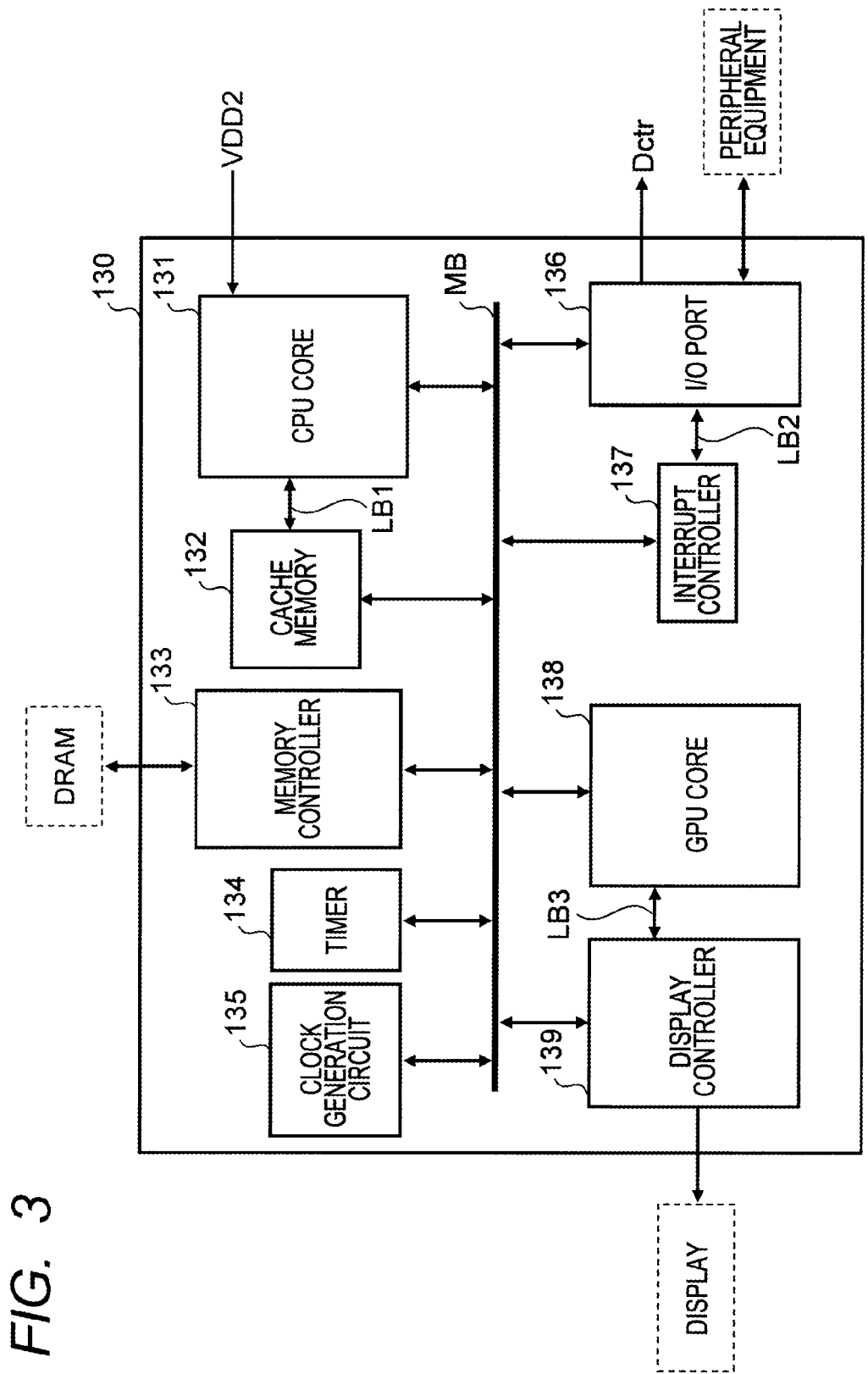
FIG. 3 is an example of a block diagram of an MCU 130 shown in FIG. 1.

Next, an internal configuration of the MCU 130 is described with reference to FIG. 3. FIG. 3 is an example of a block diagram of the MCU 130 shown in FIG. 1. As shown in FIG. 3, the MCU 130 is provided with function blocks including a central processing unit (CPU) core 131, a cache memory 132, a memory controller 133, a timer 134, a clock generation circuit 135, an input/output (I/O) port 136, an interrupt controller 137, a graphics processing unit (GPU) core 138, and a display controller 139. Herein, the respective function blocks are coupled with each other via a main bus MB.

The CPU core 131 is the heart of the MCU 130 that executes various processing on the basis of a control program. With the present embodiment, the CPU core 131 generates a digital control signal Dctr corresponding to an operation state of the CPU core 131 itself. This digital control signal Dctr is outputted to the PMIC 100 via the main bus MB and the I/O port 136, respectively.

The cache memory 132 is coupled to the CPU core 131 via a local bus LB1. This will enable high-speed accessing from the CPU core 131 to the cache memory 132. Data that is high in application frequency within, for example, the CPU core 131 is stored in the cache memory 132.

The memory controller 133 controls read, write, refresh, and so forth against a dynamic random access memory (DRAM) serving as an external memory. For example, the memory controller 133 writes data transferred from the cache memory 132 via the main bus MB to the DRAM. Conversely, the memory controller 133 reads data stored in the DRAM. This data as read is transferred to the cache memory 132 via, for example, the main bus MB.

The timer 134 measures time by clock counting. The timer 134 is put to use in the case of executing, for example, periodical interruption processing, and so forth. The clock generation circuit 135 is, for example, a phase-locked loop (PLL) circuit, and so forth, the clock generation circuit 135 generating an operation clock at a predetermined frequency that is a frequency obtained by multiplying a reference clock at which a crystal oscillator oscillates. The operation clock as generated is distributed to the respective function blocks.

The I/O port 136 is an interface for coupling the MCU 130 to the PMIC 100, and peripheral equipment, respectively. The interrupt controller 137 is coupled to the I/O port 136 via a local bus LB2. Accordingly, a highly real-time request for interruption processing, coming from the peripheral equipment, can be smoothly transferred to the CPU core 131. The interrupt controller 137 transfers the request for interruption processing, coming from the peripheral equipment, to the CPU core 131 in adequate sequence on the basis of priority set on an equipment-by-equipment basis.

The GPU core 138 is a processor dedicated for image processing. For example, the GPU core 138 executes processing of image data transferred from the DRAM via the memory controller 133 and the main bus MB before outputting to the display controller 139. The display controller 139 is coupled to the GPU core 138 via a local bus LB3. The display controller 139 outputs the image data received from the GPU core 138 to a display.

As described above, the power supply voltage VDD2 to be applied to the CPU core 131 is generated on the basis of the digital control signal Dctr. That is, a variable power supply voltage VDD2 is applied to the CPU core 131, as shown in FIG. 3. A fixed power supply voltage VDD1 is applied to the function blocks other than the CPU core 131. Herein, with the use of the principle underlying the operation of the PMIC 100 described as above, as to, for example, the GPU core 138 as well, a variable power supply voltage according to an operation state thereof may be applied thereto. Further, with the use of the principle underlying the operation of the PMIC 100 described as above, as to the function blocks other than those, a variable power supply voltage according to an operation state thereof may be similarly applied thereto.

Figure 4:
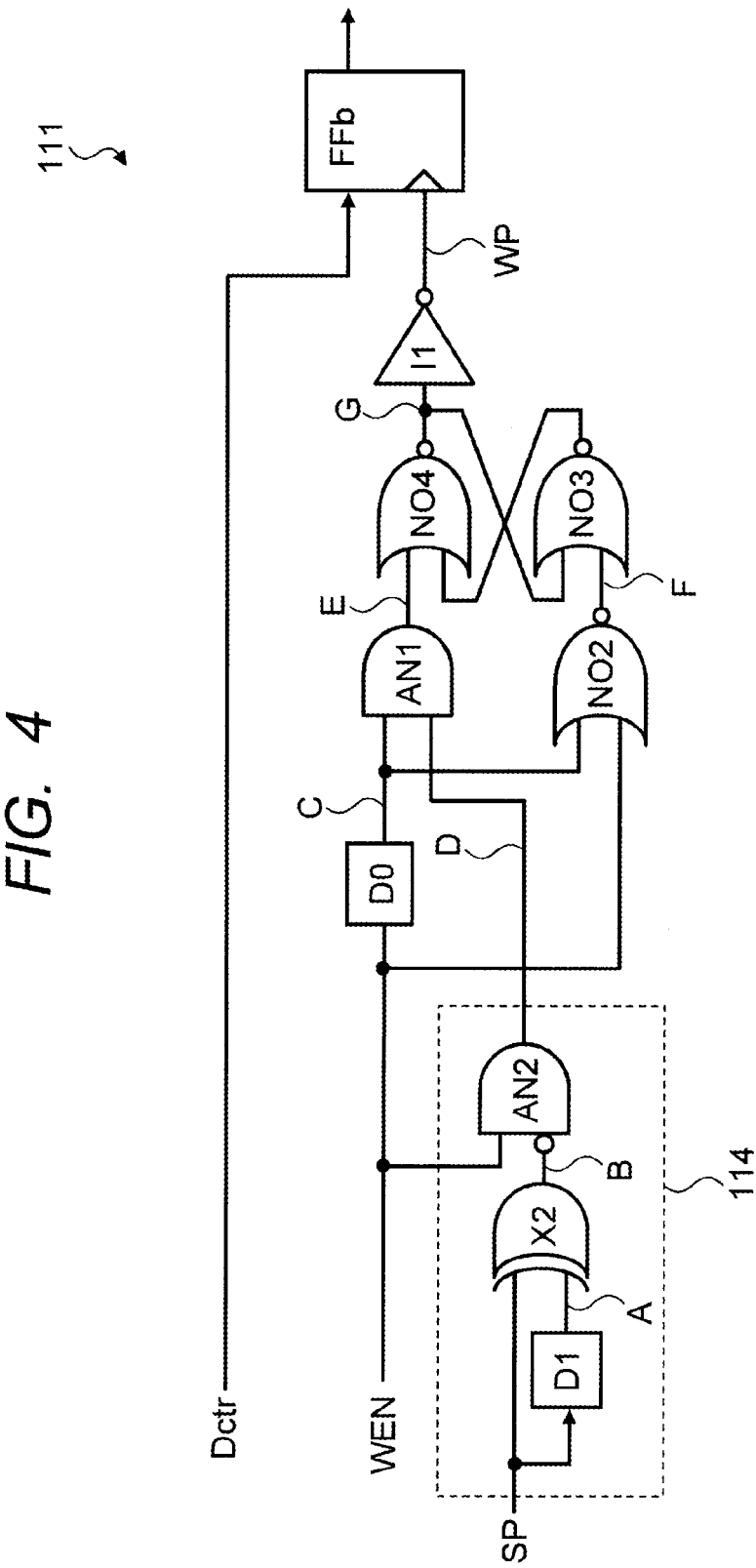
FIG. 4 is a circuit diagram of a digital control signal hold circuit 111 according to the first embodiment of the invention.

Next, the digital control signal hold circuit 111 is described in detail hereinafter with reference to FIG. 4. FIG. 4 is a circuit diagram of the digital control signal hold circuit 111 according to the first embodiment of the invention. As shown in FIG. 4, the digital control signal hold circuit 111 is provided with delay circuits D0, D1, an XOR gate X2, NOR gates NO2 to NO4, AND gates AN1, AN2, an inverter I1, and a flip-flop FFb.

Further, a bit count of the digital control signal Dctr is dependent on the number of duty ratio switching steps in the duty control circuit 110. There can be adopted switch-over in two steps in the case of 1 bit, switch-over in four steps in the case of 2 bits, switch-over in eight steps in the case of 3 bits, and so on. In FIG. 4, there is shown a representative case where the bit count of the digital control signal Dctr is "1". If the bit count of the digital control signal Dctr is "n", as described later on in the case of a second embodiment of the invention, n flip-flops are required.

As shown in FIG. 4, the switching pulse signal SP that is an output signal from the PWM signal generation circuit 113 is fed back to one input of the XOR gate X2. A signal A that is the switching pulse signal SP that is delayed by the delay circuit D1 is inputted to the other input of the XOR gate X2.

The inversion signal of a signal B outputted from the XOR gate X2 is inputted to one input of the AND gate AN2. A write enable signal WEN is inputted to the other input of the AND gate AN2. The write enable signal WEN is an enable signal undergoing a switch-over from low (L) to high (H) in the case where there occurs a change in value of the digital control signal Dctr to be held at H for only a predetermined time period to be subsequently switched over to L.

A signal C that is the write enable signal WEN delayed by the delay circuit D0 is inputted to one input of the AND gate AN1. A signal D outputted from the AND gate AN2 is inputted to the other input of the AND gate AN1. The write enable signal WEN is inputted to one input of the NOR gate NO2. The signal C that is the write enable signal WEN delayed by the delay circuit D0 is inputted to the other input of the NOR gate NO2.

A signal F outputted from the NOR gate NO2 is inputted to one input of the NOR gate NO3. A signal outputted from the NOR gate NO4 described later on is inputted to the other input of the NOR gate NO3. A signal E outputted from the AND gate AN1 is inputted to one input of the NOR gate NO4. A signal outputted from the NOR gate NO3 is inputted to one input of the NOR gate NO4. Herein, the NOR gates NO3, NO4 make up an RS latch circuit. A signal G outputted from the NOR gate NO4 is inputted to the inverter I1. The inverter I1 outputs a write pulse signal WP that is an inversion signal of the signal G.

The flip-flop FFb is a D flip-flop, and the write pulse signal WP is inputted to a clock input thereof. Further, the digital control signal Dctr is inputted to a delay input thereof. More specifically, if the digital control signal Dctr makes a transition, the digital control signal Dctr is fetched by the flip-flop FFb at timing when the write pulse signal WP makes an L to H transition before being outputted to the DAC 112.

In FIG. 4, the delay circuit D1, the XOR gate X2, and the AND gate AN2 make up a mask signal generation circuit 114 representing a characteristic configuration according to the present embodiment of the invention. The mask signal generation circuit 114 generates a mask signal from a relevant switching pulse signal SP, the mask signal being for use in keeping the digital control signal Dctr from being fetched in a power-source noise occurrence time period after the switching pulse signal SP makes a transition.

In this connection, by feeding back the switching pulse signal SP instead of the output pulse signal, the power-source noise caused by the output pulse signal generated from the switching pulse signal SP can be avoided with certainty. If the output pulse signal is used as a feedback signal, time from transition of the feedback signal to occurrence of the power-source noise will be shorter than that in the case of using the switching pulse signal SP, so that there is a risk that the power-source noise cannot be effectively avoided.

Further, as described later on in the present description, the AND gate AN2 is not essential in the mask signal generation circuit 114. However, the AND gate AN2 is preferably adopted in order to remove noise of the write enable signal WEN itself.

Figure 5:
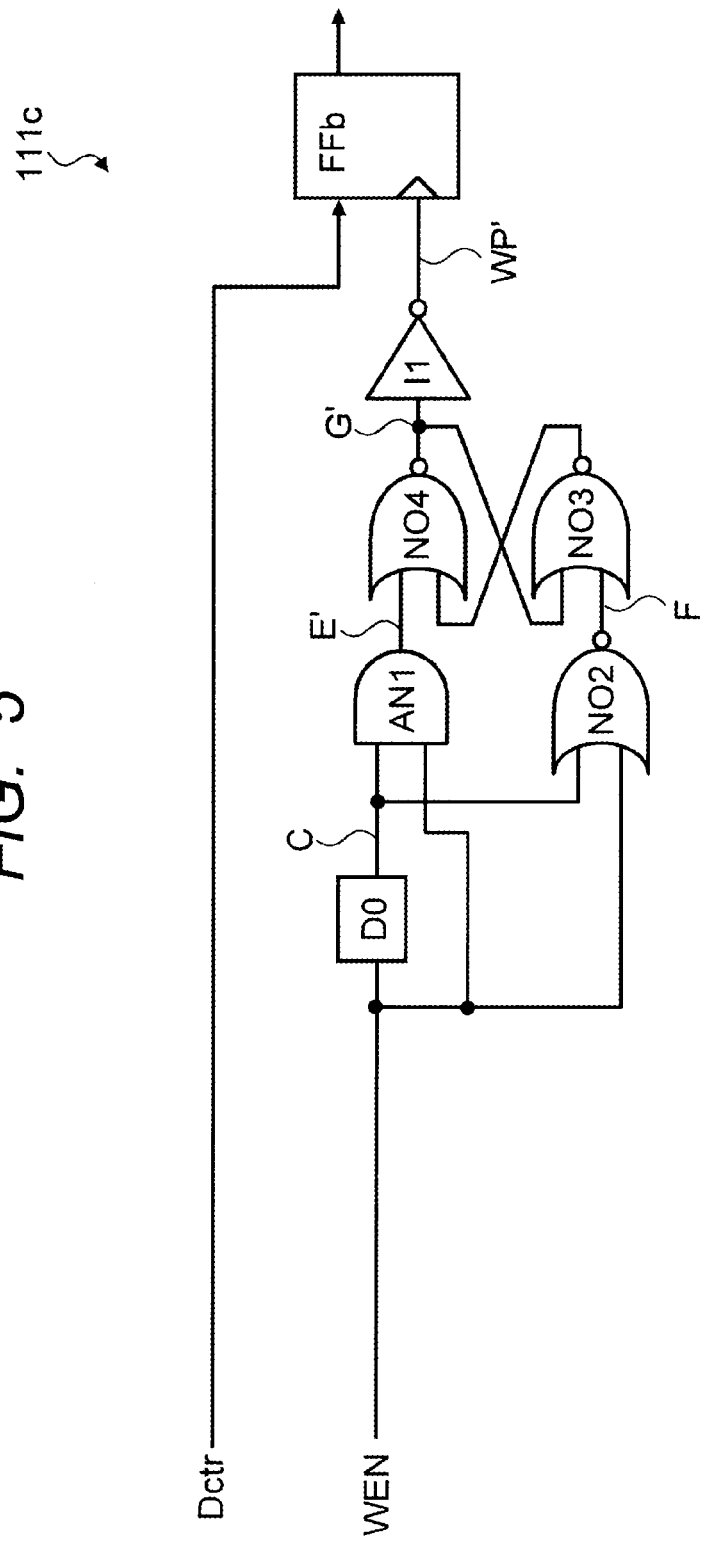
FIG. 5 is a circuit diagram of a digital control signal hold circuit 111c according to a comparative example of the first embodiment of the invention.

Next, referring to FIG. 5, there is described in detail hereinafter a digital control signal hold circuit 111c according to a comparative example of the first embodiment of the invention. FIG. 5 is a circuit diagram of the digital control signal hold circuit 111c according to the comparative example of the first embodiment.

The digital control signal hold circuit 111c shown in FIG. 5 is not provided with the mask signal generation circuit 114 in the digital control signal hold circuit 111, shown in FIG. 4, that is, the digital control signal hold circuit 111c does not include the delay circuit D1, the XOR gate X2, and the AND gate AN2. More specifically, in place of the signal D outputted from the AND gate AN2 in the digital control signal hold circuit 111 of FIG. 4, the write enable signal WEN is inputted to the AND gate AN1. In FIG. 5, coupling interrelation in other respects is similar to that in FIG. 4, omitting therefore description of the coupling interrelation.

Now, a signal C in FIG. 5 is a signal identical to the signal C in FIG. 4. Further, a signal F in FIG. 5 is a signal identical to the signal F in FIG. 4. On the other hand, since one of the inputs to an AND gate AN1 in FIG. 5 differs from that in FIG. 4, as described above, a signal E' outputted from the AND gate AN1 in FIG. 5 is a signal different from the signal E outputted from the AND gate AN1 in FIG. 4. Further, in FIG. 5, a signal G' outputted from an NOR gate NO4 is a signal different from the signal G outputted from the NOR gate NO4 in FIG. 4. Accordingly, in FIG. 5, a write pulse signal WP' is a signal different from the write pulse signal WP in FIG. 4.

Figure 6:
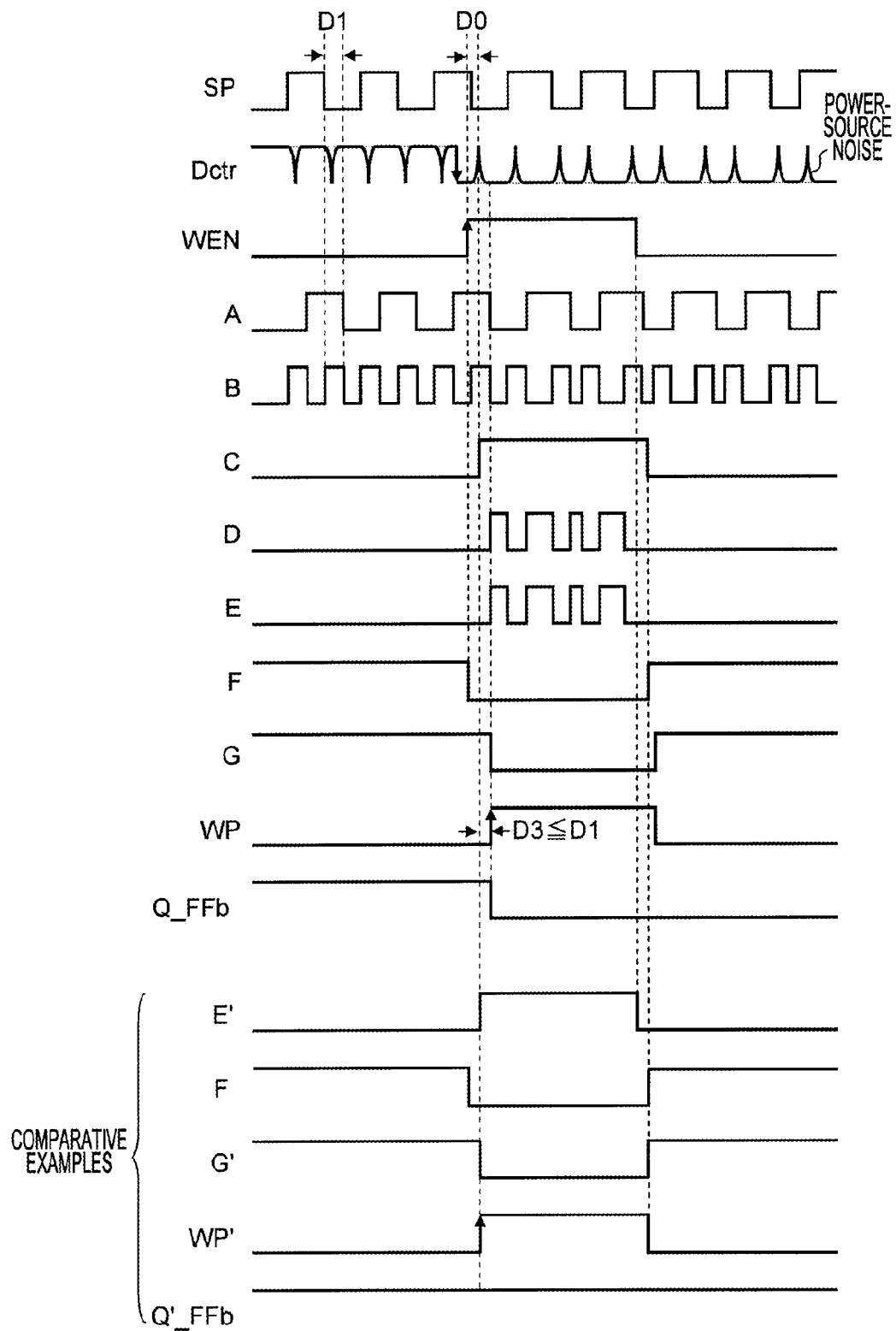
FIG. 6 is a timing chart for comparing an operation of the circuit according to the embodiment shown in FIG. 4 with an operation of the circuit according to the comparative example shown in FIG. 5 (the case where a fetching error occurs in the comparative example)
Figure 7:
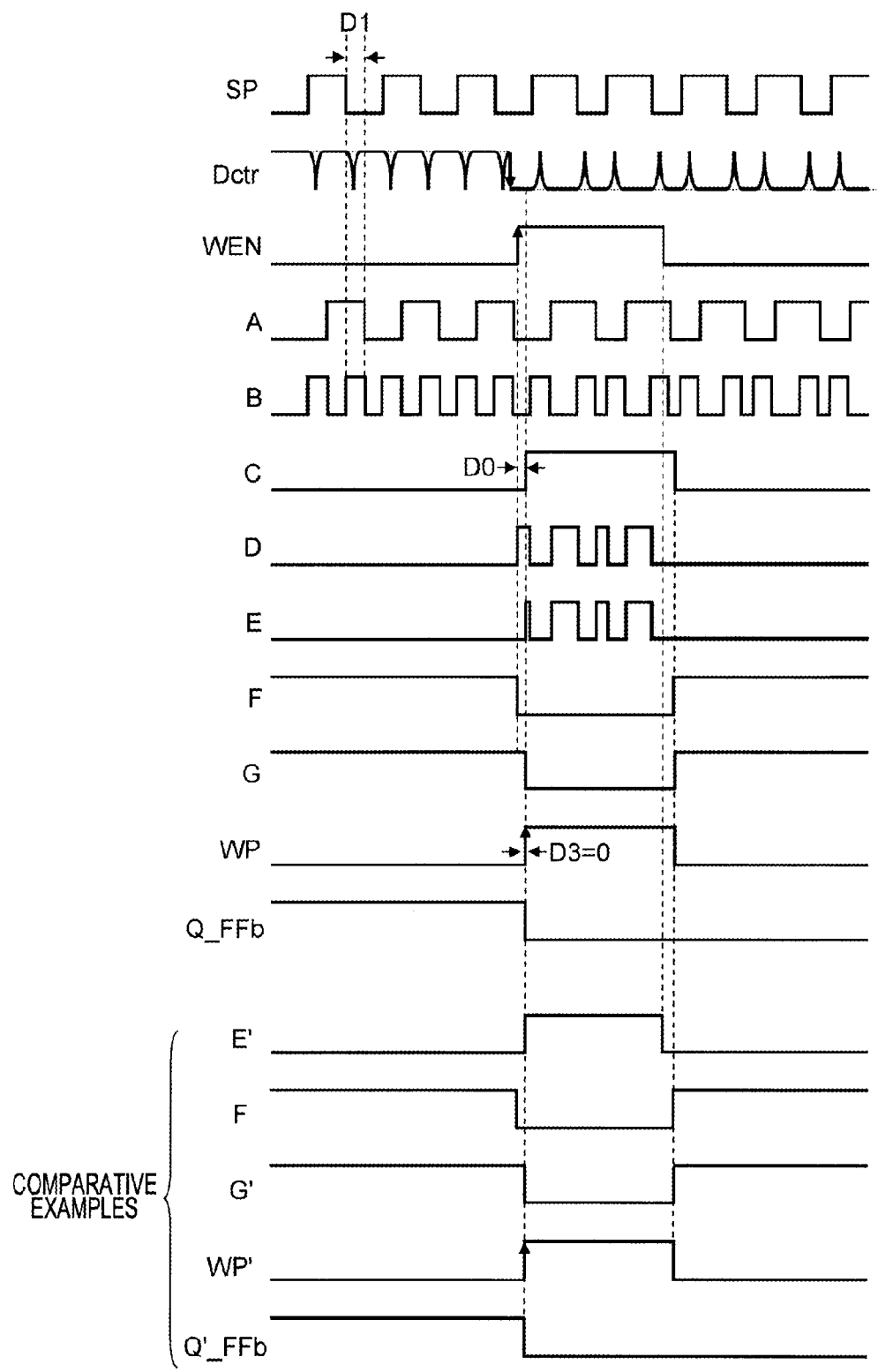
FIG. 7 is a timing chart for comparing the operation of the circuit according to the embodiment shown in FIG. 4 with the operation of the circuit according to the comparative example shown in FIG. 5 (the case where the fetching error does not occur in the comparative example)

Next, referring to FIGS. 6, 7, there are described respective operations of the circuit according to the embodiment shown in FIG. 4, and the circuit according to the comparative example shown in FIG. 5. FIG. 6 is a timing chart for comparing the operation of the circuit according to the embodiment shown in FIG. 4 with the operation of the circuit according to the comparative example shown in FIG. 5, thereby showing the case where a fetching error occurs in the comparative example. FIG. 7 is a timing chart for comparing the operation of the circuit according to the embodiment shown in FIG. 4 with the operation of the circuit according to the comparative example shown in FIG. 5, thereby showing the case where the fetching error does not occur in the comparative example.

At the uppermost level in FIG. 6, there is shown a switching pulse signal SP. The switching pulse signal SP periodically repeats a transition to H (the power supply voltage VDD1) and a transition to L (the ground voltage GND). At the second highest level, there is shown a digital control signal Dctr. In FIG. 6, there is shown the case where the left side in the figure represents H and the right side in the figure represents L. As shown in FIG. 6, a power-source noise occurs to the digital control signal Dctr every time the switching pulse signal SP makes a transition.

At the third level, there is shown a write enable signal WEN. The write enable signal WEN remains at L unless the digital control signal Dctr makes a transition while making a transition to H for a predetermined period of time if the digital control signal Dctr makes a transition. Herein, since the transition of the digital control signal Dctr is accompanied by generation of the write enable signal WEN, rise timing of the write enable signal WEN is delayed from transition timing of the digital control signal Dctr.

At the fourth level, there is shown the signal A that is the switching pulse signal SP delayed by the delay circuit D1 in FIG. 4. At the fifth level, there is shown the signal B (the mask signal) outputted from the XOR gate X2 in FIG. 4. The signal B has an H-time period in agreement with a delay amount D1 caused by the delay circuit D1. The H-time period of the signal B corresponds to the power-source noise occurrence time period while an L-time period of the signal B corresponds to the power-source noise nonoccurrence time period. Herein, the delay amount D1 caused by the delay circuit D1 is preferably less than ½ of a constant cycle of the switching pulse signal SP, or more preferably less than ¼ thereof from a standpoint of throughput. At the sixth level, there is shown the signal C that is the write enable signal WEN delayed by the delay circuit D0.

At the seventh level, there is shown the signal D outputted from the AND gate AN2 where the write enable signal WEN and the inversion signal of the signal B are inputted in FIG. 4. At the eighth level, there is shown the signal E outputted from the AND gate AN1 where the signal C and the signal D are inputted in FIG. 4. At the ninth level, there is shown the signal F outputted from the NOR gate NO2 where the write enable signal WEN and the signal C are inputted in FIG. 4.

At the tenth level, there is shown the signal G outputted from the NOR gate NO4 where the signal outputted from the NOR gate NO3 and the signal E are inputted in FIG. 4. At the eleventh level, there is shown the write pulse signal WP that is the inversion signal of the signal G in FIG. 4. At the twelfth level, there is shown a noninverting output Q_FFb of the flip-flop FFb in FIG. 4. At the rising edge of the write pulse signal WP, a value L of the digital control signal Dctr is fetched by the flip-flop FFb. Herein, the rising edge of the write pulse signal WP corresponds to the power-source noise nonoccurrence time period, so that a fetching error does not occur.

At the thirteenth level, there is shown the signal E' outputted from the AND gate AN1 where the write enable signal WEN, and the signal C are inputted in FIG. 5. At the fourteenth level, there is shown the signal F again for the sake of clarity. At the fifteenth level, there is shown the signal outputted from the NOR gate NO3 and the signal G' outputted from an NOR gate NO4 where the signal E' is inputted.

At the sixteenth level, there is shown the write pulse signal WP' that is the inversion signal of the signal G' in FIG. 5. At the seventeenth level, that is, the lowermost level in the figure, there is shown a noninverting output Q'_FFb of the flip-flop FFb in FIG. 5. At the rising edge of the write pulse signal WP', the value L of the digital control signal Dctr is fetched by the flip-flop FFb. Herein, the rising edge of the write pulse signal WP' corresponds to the power-source noise occurrence time period, so that a fetching error occurs. More specifically, an erroneous value H as the value of the digital control signal Dctr has been fetched, and a transition has not occurred to the noninverting output Q'_FFb of the flip-flop FFb.

At this point in time, the signal C is identical in waveform to the write pulse signal WP' in the comparative example. With the digital control signal hold circuit 111 according to the present embodiment, if the rising edge of the signal C is in the H-time period of the signal B, that is, the power-source noise occurrence time period as shown in FIG. 6, the write pulse signal WP is delayed in rising until the signal B makes a transition to L. In other words, the write pulse signal WP is masked for the duration of the signal B at H, and upon the signal B making a transition to L, the write pulse signal WP is caused to make a transition.

By so doing, occurrence of the fetching error, caused by the power-source noise, can be prevented with certainty. Furthermore, a delay amount D3 of the write pulse signal WP, against the write pulse signal WP' (that is, the signal C) in the comparative example will be equal to or less than the delay amount D1 of the delay circuit D1, as shown in FIG. 6, so that throughput will be excellent.

Next, referring to FIG. 7, there is described the operation of the circuit in the case where the fetching error does not occur in the comparative example. Signals shown in FIG. 7 are identical to those signals shown FIG. 6, respectively, omitting therefore description thereof. In FIG. 7, the rising edge of the write pulse signal WP' corresponds to the power-source noise nonoccurrence time period, so that a fetching error does not occur. More specifically, a correct value L as the value of the digital control signal Dctr has been fetched, and a transition has occurred to the noninverting output Q'_FFb of the flip-flop FFb.

Herein, with the digital control signal hold circuit 111 according to the present embodiment, if the rising edge of the signal C (that is, the write pulse signal WP' in the comparative example) corresponds to the L-time period of the signal B (that is, the power-source noise nonoccurrence time period), as shown in FIG. 7, the write pulse signal WP is caused to rise concurrently with the signal C without delaying the write pulse signal WP. In this case, it holds that the delay amount D3=0 against the write pulse signal WP' in the comparative example (that is, the signal C), as shown in FIG. 6, so that throughput will be excellent.

As described in the foregoing, with the semiconductor device according to the present embodiment of the invention, at whatever timing the digital control signal Dctr makes a transition to be accompanied by a transition of the write enable signal WEN, the occurrence of the fetching error, caused by the power-source noise, can be prevented with certainty. Furthermore, because it is sufficient to have fetching timing delayed by only one power-source noise occurrence time period at the maximum, the semiconductor device according to the present embodiment is excellent in throughput.

Figure 8:
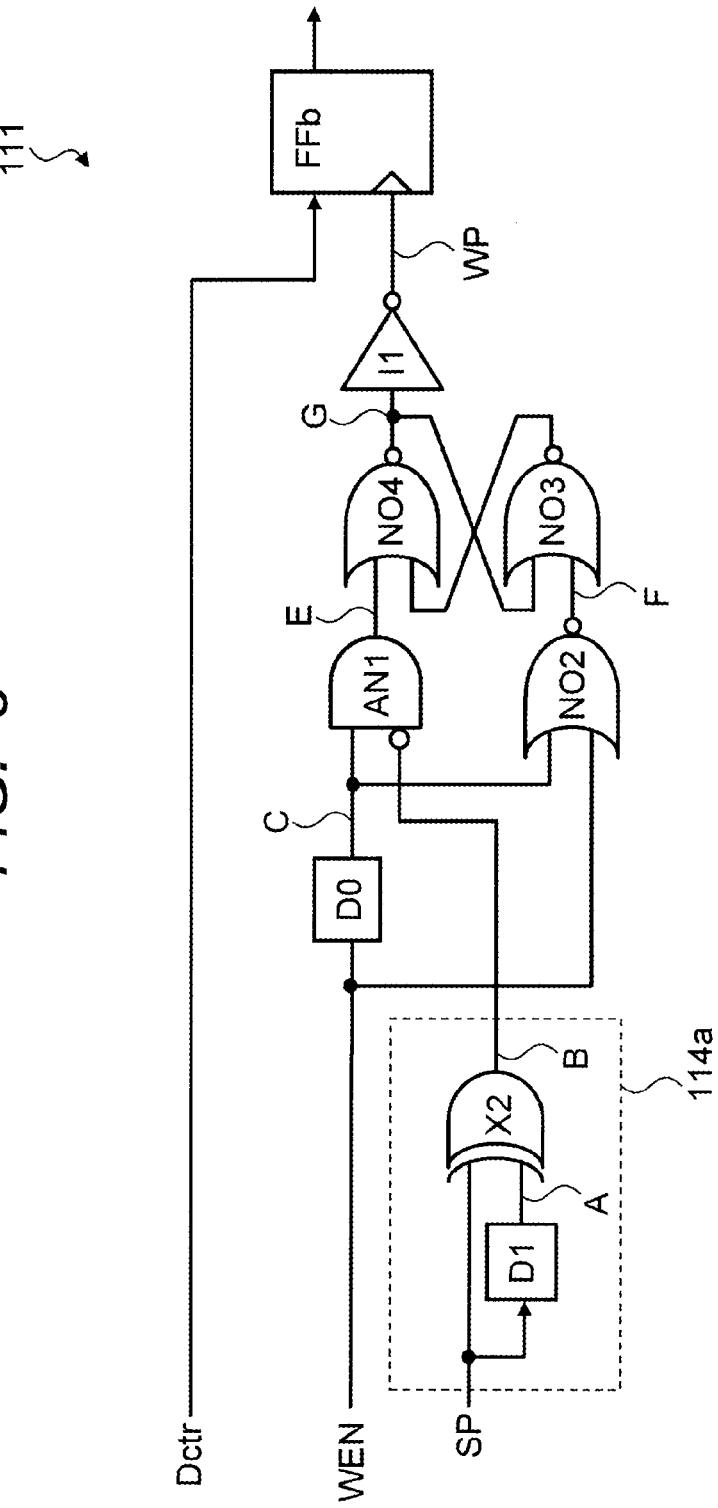
FIG. 8 is a circuit diagram of a variation of the digital control signal hold circuit 111 according to the first embodiment of the invention.

Next, referring to FIG. 8, there is described a variation of the digital control signal hold circuit 111 shown in FIG. 4. FIG. 8 is a circuit diagram of a variation of the digital control signal hold circuit 111 according to the first embodiment of the invention. With the variation of the digital control signal hold circuit 111, shown in FIG. 8, a mask signal generation circuit 114a is made up of a delay circuit D1 and an XOR gate X2 only, and the AND gate AN2 is not provided.

More specifically, in place of the signal D outputted from the AND gate AN2 in FIG. 4, an inversion signal of a signal B outputted from the XOR gate X2 is inputted directly to an AND gate AN1. In FIG. 8, a circuit configuration in other respects is identical to that in FIG. 4, omitting therefore description thereof. Even with a circuit configuration shown in FIG. 8, the fetching error occurring to the digital signal, due to the power-source noise, can be prevented, as is the case shown FIG. 4, and the variation is excellent in throughput.

Second Embodiment

Figure 9:
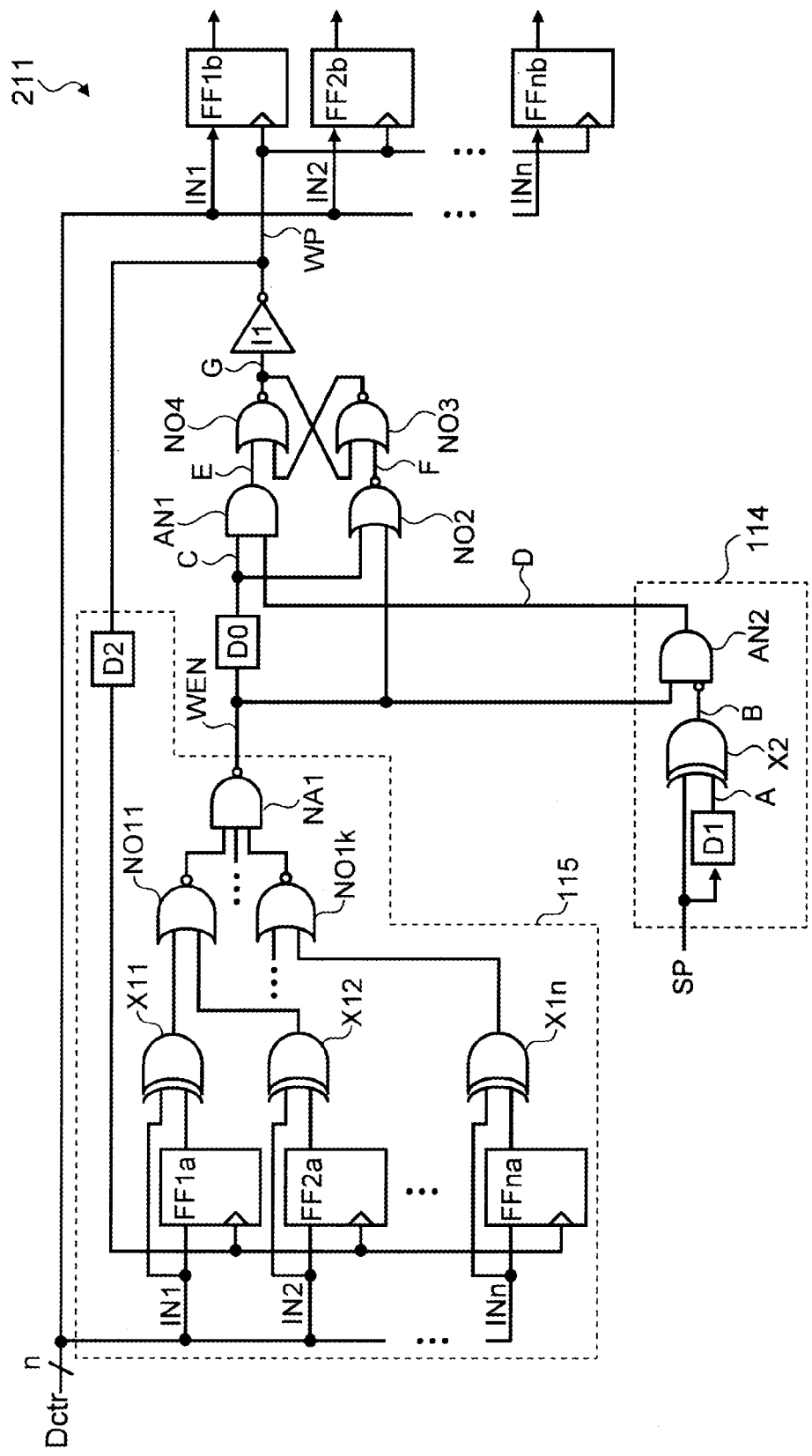
FIG. 9 is a circuit diagram of a digital control signal hold circuit 211 according to a second embodiment of the invention.

Now, referring to FIG. 9, there is described a semiconductor device according to the second embodiment of the invention. FIG. 9 is a circuit diagram of a digital control signal hold circuit 211 according to the second embodiment of the invention. In FIG. 9, a bit count of a digital control signal Dctr is "n". The digital control signal Dctr is made up of signals IN1 to INn.

As shown in FIG. 9, the digital control signal hold circuit 211 is provided with flip-flops FF1b to FFnb, corresponding to one flip-flop FFb in the digital control signal hold circuit 111 of FIG. 4. The signals IN1 to INn, making up the digital control signal Dctr, are each inputted to respective delay inputs of the flip-flops FF1b to FFnb. A write pulse signal WP in common use is inputted to respective clock inputs of the flip-flops FF1b to FFnb.

Further, the digital control signal hold circuit 211 is provided with a write control signal generation circuit 115 for generating a write enable signal WEN from the digital control signal Dctr. As shown in FIG. 9, the write control signal generation circuit 115 is provided with flip-flops FF1a to FFna, XOR gates X11 to X1n, NOR gates NO11 to NO1k, and one NAND gate NA1.

The signals IN1 to INn, making up the digital control signal Dctr, are each inputted to respective delay inputs of the flip-flops FF1a to FFna. A signal in common use, that is, the write pulse signal WP delayed by a delay circuit D2, is inputted to respective clock inputs of the flip-flops FF1a to FFna. The signals IN1 to INn, making up the digital control signal Dctr, are each inputted to one input of each of the XOR gates X11 to X1n. A noninverting output signal of each of the flip-flops FF1a to FFna is inputted to the other input of each of the XOR gates X11 to X1n.

An output signal from the XOR gate X11 is inputted to one input of the NOR gate NO11 while an output signal from the XOR gate X12 is inputted to the other input of the NOR gate NO11. An output signal from an XOR gate X13 (not shown) is inputted to one input of an NOR gate NO12 (not shown), and an output signal from an XOR gate X14 (not shown) is inputted to the other input of the NOR gate NO12. An output signal from an XOR gate X15 is inputted to one input of an NOR gate NO13, and an output signal from an XOR gate X16 is inputted to the other input of the NOR gate NO13. Thereafter, an output signal from an XOR gate X1n−1 is similarly inputted to one input of the NOR gate NO1k, and an output signal from the XOR gate X1n is similarly inputted to the other input of the NOR gate NO1k. In this case, K=n/2. However, as the NOR gate NO1k does not necessarily have two inputs, a value k represents an optional value.

Respective output signals from the NOR gates NO11 to NO1k are each inputted to the NAND gate NA1, and a write enable signal WEN is outputted from the NAND gate NA1. A configuration of the digital control signal hold circuit 211 is identical in other respects to that of the digital control signal hold circuit 111 shown in FIG. 4, omitting therefore description thereof.

Next, there is described hereinafter a transition of the write enable signal WEN. Unless a transition occurs to any of the signals IN1 to INn making up the digital control signal Dctr, each of the signals IN1 to INn will match each of the noninverting output signals delivered from the flip-flops FF1a to FFna, respectively, so that respective output signals from the XOR gates X11 to X1n will be all at L. Accordingly, respective output signals from the NOR gates NO11 to NO1k will be all at H. In consequence, the write enable signal WEN that is an output signal from the NAND gate NA1 will be at L.

Meanwhile, let us suppose the case where a transition occurs to any of the signals IN1 to INn, making up the digital control signal Dctr. In this case, assuming that a transition occurs to the signal IN1, the noninverting output signal from the flip-flop FF1a is maintained even if the transition occurs to the signal IN1, so that the noninverting output signal does not match the signal IN1. Accordingly, the output signal of the XOR gate X11 will be at H. Meanwhile, the respective output signals of the XOR gates X12 to X1n will all remain at L. In consequence, the output signal of the NOR gate NO11 will be at L. On the other hand, respective output signals of the NOR gates NO12 to NO1k, other than the NOR gate NO11, will all remain at H. Hence, the write enable signal WEN that is an output signal from the NAND gate NA1 will be at H.

Upon the write enable signal WEN making a transition to H, the respective clock inputs of the flip-flops FF1a to FFna subsequently make an L to H transition. By so doing, the signal IN1 will come to match the noninverting output signal of the flip-flop FF1a again, so that the write enable signal WEN makes an H to L transition.

Figure 10:
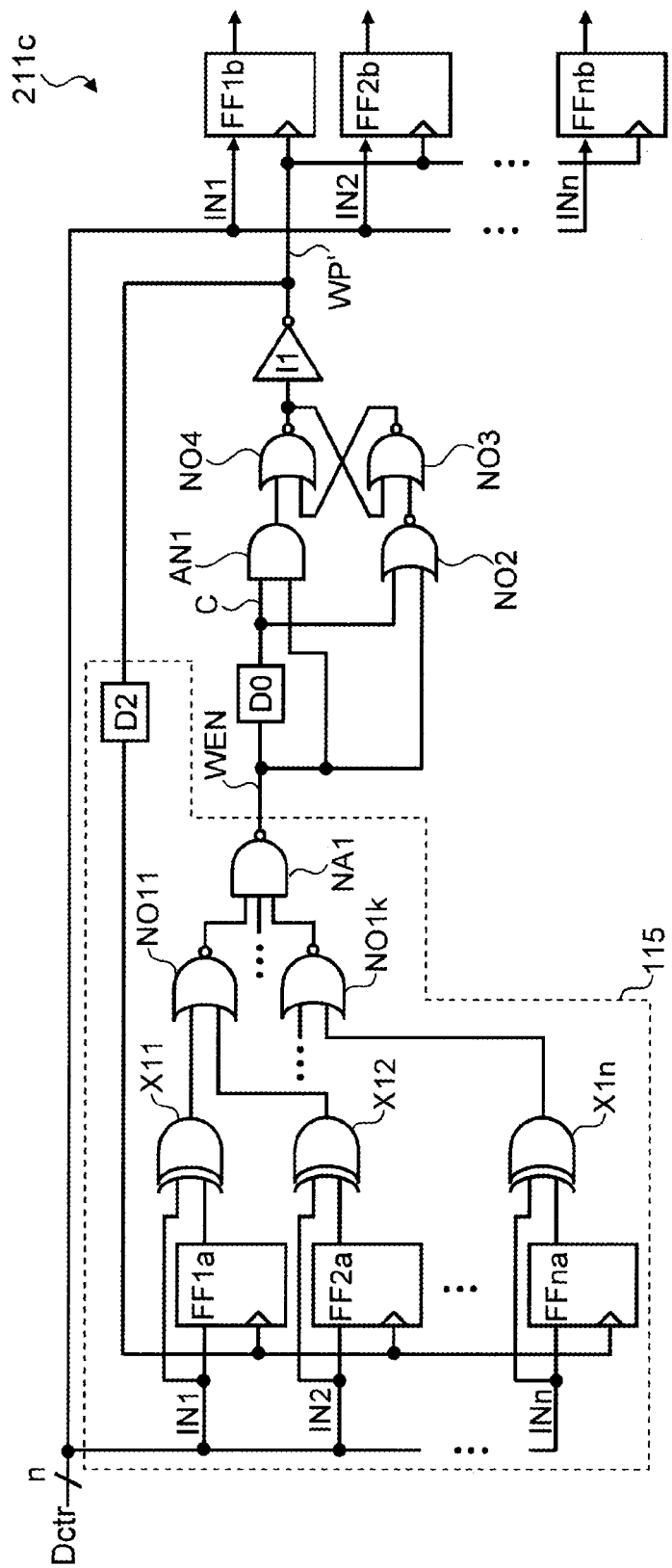
FIG. 10 is a circuit diagram of a digital control signal hold circuit 211c according to a comparative example of the second embodiment of the invention.

Next, referring to FIG. 10, there is described a digital control signal hold circuit 211c according to a comparative example of the second embodiment of the invention. FIG. 10 is a circuit diagram of the digital control signal hold circuit 211c according to the comparative example of the second embodiment of the invention.

The digital control signal hold circuit 211c of FIG. 10 is not provided with the mask signal generation circuit 114 of the digital control signal hold circuit 211 in FIG. 9, that is, the digital control signal hold circuit 211c is not provided with the delay circuit D1, the XOR gate X2, and the AND gate AN2. More specifically, in place of the signal D outputted from the AND gate AN2 in the digital control signal hold circuit 211 of FIG. 9, a write enable signal WEN is inputted to the AND gate AN1. In FIG. 10, coupling interrelation in other respects is similar to that in FIG. 9, omitting therefore description of the coupling interrelation.

Herein, a signal C in FIG. 10 is a signal identical to the signal C in FIG. 9. Meanwhile, as is the case with the first embodiment of the invention, a write pulse signal WP' in FIG. 10 is a signal different from the write pulse signal WP shown in FIG. 9.

Figure 11:
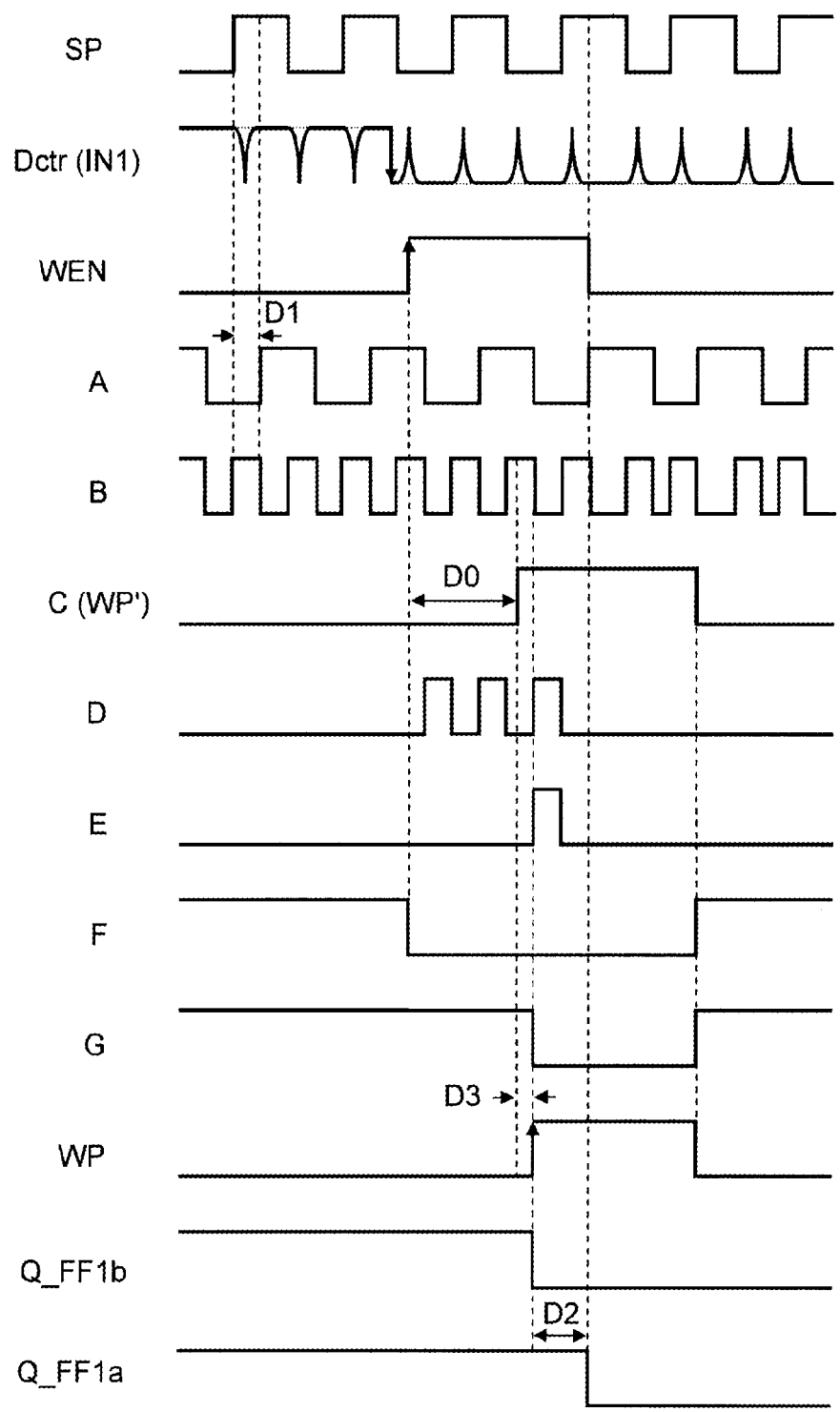
FIG. 11 is a timing chart for describing an operation of the circuit according to the embodiment shown in FIG. 9 (the case where a delay amount D0 is large)
Figure 12:
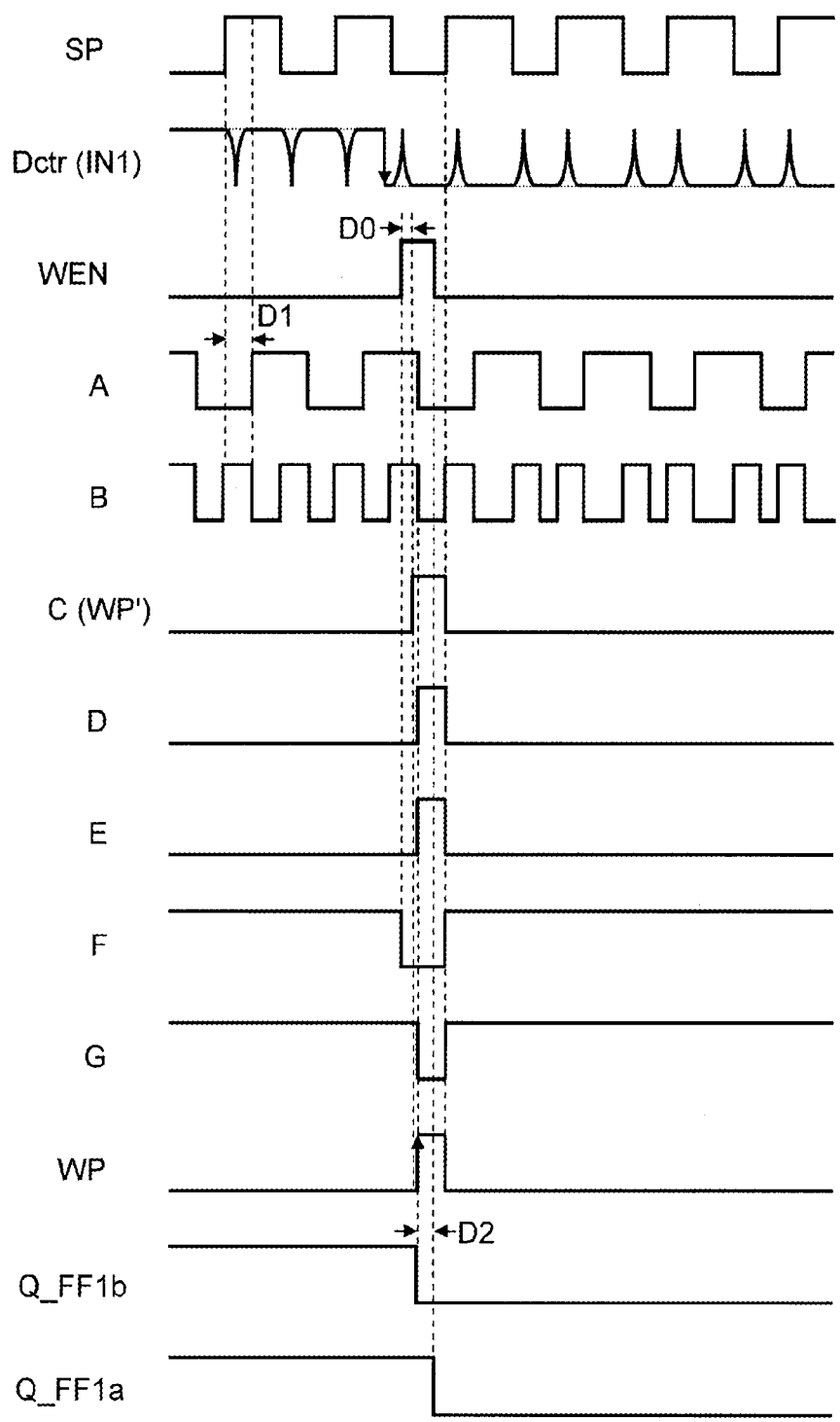
FIG. 12 is a timing chart for describing the operation of the circuit according to the embodiment shown in FIG. 9 (the case where the delay amount D0 is small)

Next, referring to FIGS. 11, 12, there is described an operation of the circuit according to the embodiment shown in FIG. 9. FIG. 11 is a timing chart for describing the operation of the circuit according to the embodiment shown in FIG. 9, showing the case where a delay amount D0 is large. FIG. 12 is a timing chart for describing the operation of the circuit according to the embodiment shown in FIG. 9, showing the case where the delay amount D0 is small.

In FIG. 11, respective signals in a range of from a switching pulse signal SP at the uppermost level to a noninverting output Q_FF1b of the flip-flop FF1b, at the twelfth level, are the signals corresponding to those in a range of from the switching pulse signal SP at the uppermost level to the noninverting output Q_FFb of the flip-flop FFb, the twelfth level, shown in FIG. 6, respectively, omitting therefore description thereof. Now, the reason why a signal C is indicated as C (WP') is because the signal C is identical in waveform to the write pulse signal WP' in the comparative example, as previously described.

Meanwhile, the noninverting output Q_FF1a of the flip-flop FF1a is shown at the lowermost level in FIGS. 11, 12, respectively. With the circuit configuration of FIG. 9, after the noninverting output Q_FF1b of the flip-flop FF1b makes an H to L transition, the noninverting output QFF1a of the flip-flop FF1a is delayed by a delay amount D2 by the agency of the delay circuit D2 before making an H to L transition, as shown in FIGS. 11, 12, respectively. Concurrently with the transition of the noninverting output QFF1a of the flip-flop FF1a, the write enable signal WEN makes an H to L transition. In FIGS. 11, 12, respective transitions of other signals are similar to those shown in FIGS. 6, 7, respectively, omitting therefore description thereof.

The same applies to the first embodiment, and a fetching error of a digital signal, caused by power-source noise, can be prevented irrespective of the delay amount D0, as shown in FIGS. 11, and 12, respectively, further the second embodiment being excellent in throughput as well. The principle of the operation is the same as in the case of the first embodiment.

Third Embodiment

Figure 13:
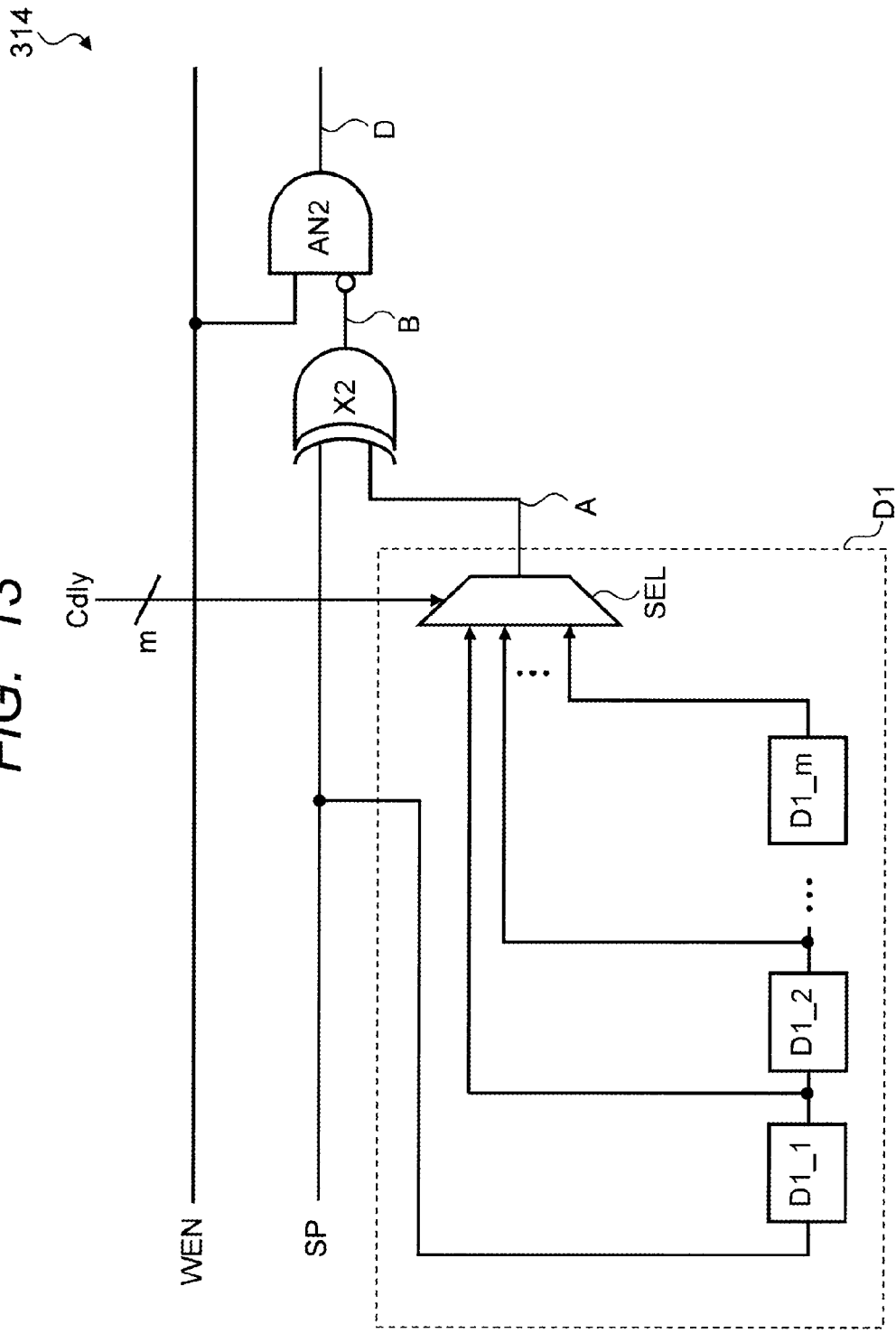
FIG. 13 is a circuit diagram of a mask signal generation circuit 314 according to a third embodiment of the invention.

Now, referring to FIG. 13, there is described a semiconductor device according to a third embodiment of the invention. FIG. 13 is a circuit diagram of a mask signal generation circuit 314 according to the third embodiment of the invention. A delay circuit D1 of the mask signal generation circuit 314 is provided with delay circuits D1_1 to D1_m, and a selector SEL. The delay circuits D1_1 to D1_m are coupled in series with each other, and respective outputs of the delay circuits D1_1 to D1_m are each coupled to m inputs of the selector SEL. A delay amount can be varied in m steps by the agency of a delay control signal Cdly inputted to the selector SEL. A circuit configuration is identical in other respects to the mask signal generation circuit 114, omitting therefore description thereof.

The delay amount may be automatically switched during operation according to a current load state of a switching circuit 120. Otherwise, the delay amount may be, for example, manually switched because occurrence timing of a power-source noise varies due to wiring provided at the time of assembling.

Fourth Embodiment

Figure 14:
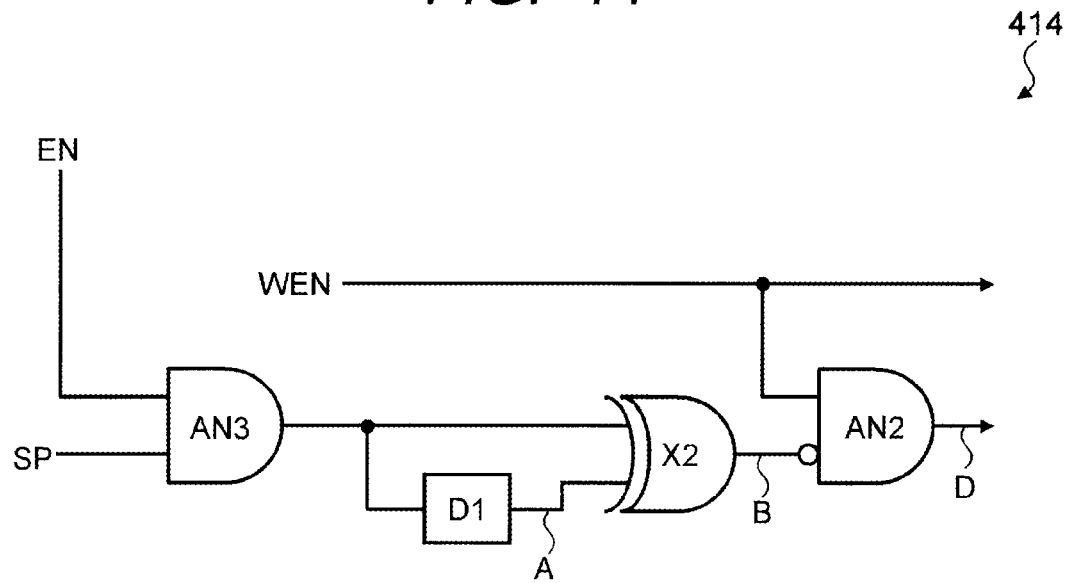
FIG. 14 is a circuit diagram of a mask signal generation circuit 414 according to a fourth embodiment of the invention.

Next, referring to FIG. 14, there is described a semiconductor device according to a fourth embodiment of the invention. FIG. 14 is a circuit diagram of a mask signal generation circuit 414 according to the fourth embodiment of the invention. An AND gate AN3 is provided in an input part of the mask signal generation circuit 414. A switching pulse signal SP, and an enable signal EN are inputted to the AND gate AN3.

If the enable signal EN is at H, the mask signal generation circuit 414 will operate, and if the enable signal EN is at L, the mask signal generation circuit 414 will stop. More specifically, if the enable signal EN is at L, a signal B will always be at L, thereby holding a relationship of a signal D=a write enable signal WEN. That is, in the figure, a configuration will be identical to that in the case of the comparative example shown in FIG. 5. A circuit configuration is identical in other respects to the mask signal generation circuit 114, omitting therefore description thereof.

It is sufficient to switch the enable signal EN according to an operation mode of, for example, the MCU 130. More specifically, in the case of the MCU 130 being in any of modes in which an operation is at a stop, or an operation rate is low, including a sleep mode, a hold mode, a standby mode, and so forth, it is sufficient to cause the enable signal EN to make a transition to L while causing the enable signal EN to make a transition to H in the case of the operation rate being high. An operation state of the MCU 130 may be determined by acquisition of a signal from the MCU 130, or by monitoring an output current of the switching circuit 120.

Fifth Embodiment

Figure 15:
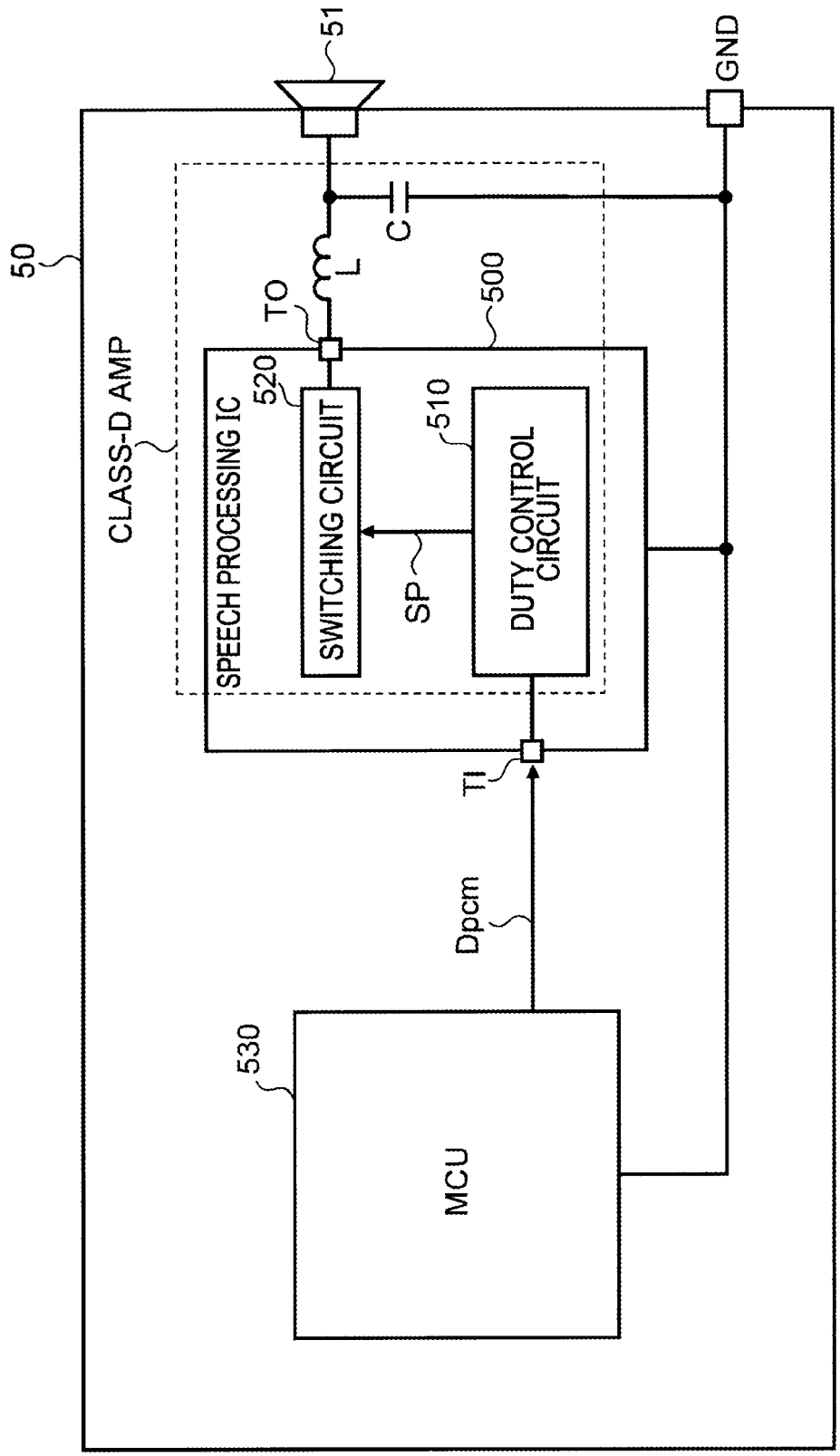
FIG. 15 is a block diagram of a circuit board where a semiconductor device according to a fifth embodiment of the invention is mounted.

Next, there is described hereinafter a semiconductor device according to a fifth embodiment of the invention with reference to FIGS. 15, and 16. FIG. 15 is a block diagram of a circuit board where the semiconductor device according to the fifth embodiment is mounted. As shown in FIG. 15, a circuit board 50 is provided with speech processing IC 500 as the semiconductor device according to the fifth embodiment, an MCU 530, a coil L, a capacitor C, and a speaker 51. The speech processing IC 500 is provided with a duty control circuit 510, and a switching circuit 520.

Further, the circuit board 50 is provided with a power-source terminal (not shown) and a ground terminal (GND). As shown in FIG. 15, the speech processing IC 500, the coil L, and the capacitor C make up a class-D amp.

The duty control circuit 510 controls a duty ratio of a switching pulse signal SP outputted on the basis of a digital speech signal Dpcm outputted from the MCU 530 to be inputted to an input terminal TI of the speech processing IC 500. The switching circuit 520 outputs an output pulse signal that is the switching pulse signal SP inputted thereto to be buffered. The duty control circuit 510 and the switching circuit 520, provided in the speech processing IC 500, will be described in detail later on.

The output pulse signal outputted from the switching circuit 520 is smoothed by an LC filter made up of the coil L, and the capacitor C to be inputted to the speaker 51. The MCU 530 generates the digital speech signal Dpcm, outputting the same to the speech processing IC 500.

Figure 16:
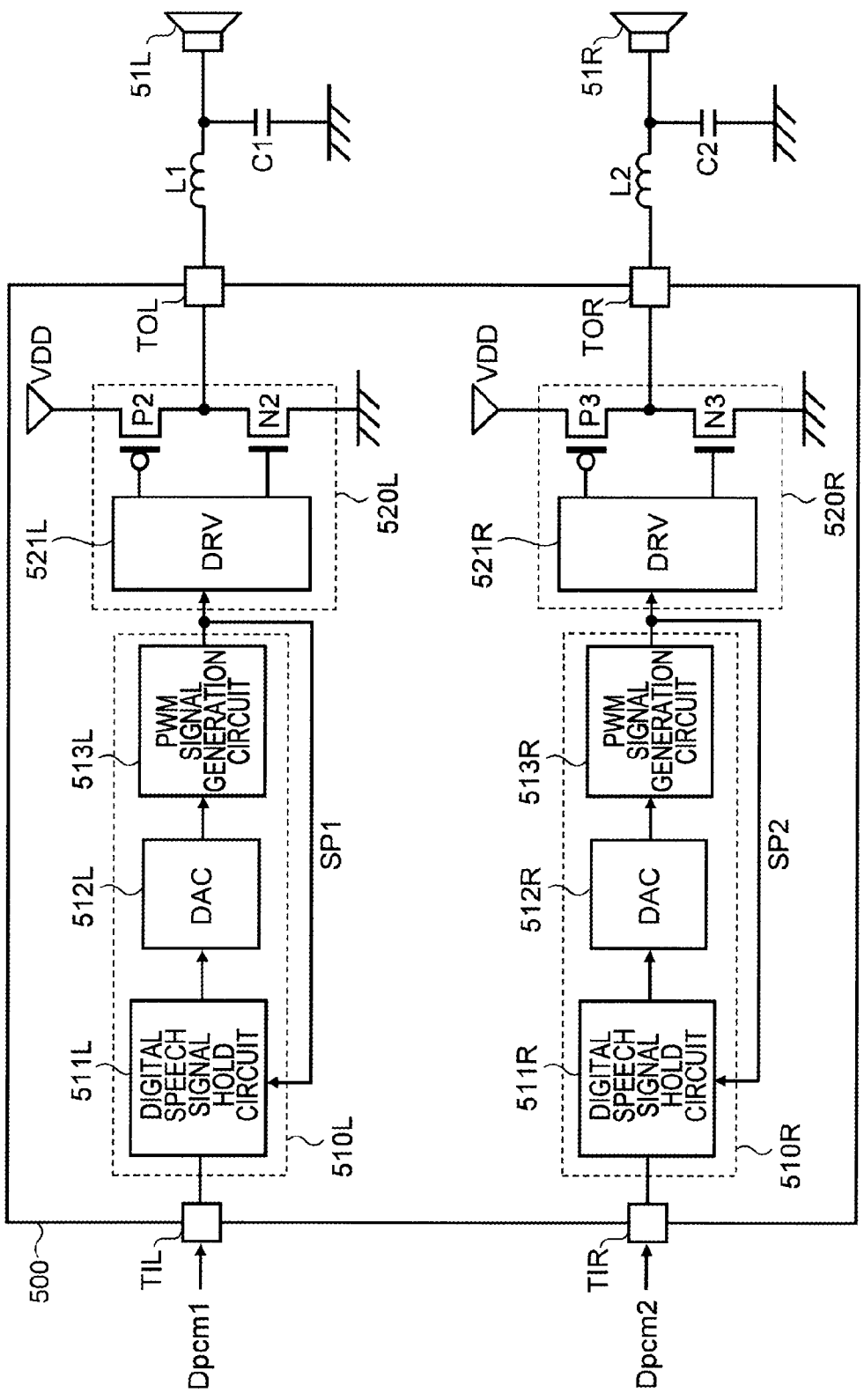
FIG. 16 is a block diagram of the semiconductor device according to the fifth embodiment of the invention.

FIG. 16 is a block diagram of the speech processing IC 500 as the semiconductor device according to the fifth embodiment. As described above, and as shown in FIG. 16, the speech processing IC 500 is provided with a duty control circuit 510L for a left-side speaker 51L, a switching circuit 520L, a duty control circuit 510R for a right-side speaker 51R, and a switching circuit 520R.

Herein, the duty control circuit 510L is provided with a digital speech signal hold circuit 511L, a DAC 512L, and a PWM signal generation circuit 513L. Similarly, the duty control circuit 510R is provided with a digital speech signal hold circuit 511R, a DAC 512R, and a PWM signal generation circuit 513R. Further, the switching circuit 520L is provided with a drive circuit 521L, a PMOS transistor P2, and an NMOS transistor N2. Similarly, the switching circuit 520R is provided with a drive circuit 521R, a PMOS transistor P3, and an NMOS transistor N3.

The digital speech signal hold circuit 511L holds a digital speech signal Dpcm 1 inputted via an input terminal TIL of the speech processing IC 500. Further, a switching pulse signal SP1 outputted from the PWM signal generation circuit 513L is fed back to the digital speech signal hold circuit 511L.

Similarly, the digital speech signal hold circuit 511R holds a digital speech signal Dpcm 2 inputted via an input terminal TIR of the speech processing IC 500. Further, switching pulse signal SP2 outputted from the PWM signal generation circuit 513R is fed back to the digital speech signal hold circuit 511R.

At this point in time, an output pulse signal is generated from the switching pulse signals SP1, SP2, whereupon there occurs a power-source noise caused by the output pulse signal. For this reason, the digital speech signal hold circuits 511L, 511R are able to find out generation timing of the power-source noise on the basis of the switching pulse signal SP1, SP2 inputted thereto, respectively.

More specifically, the power-source noise occurs immediately after a signal transition ("rising", or "falling") of the output pulse signal on a transition-by-transition basis. Accordingly, a digital speech signal hold circuit 511 does not fetch a digital speech signal Dpcm for a predetermined time period in order to prevent a fetching error caused by the power-source noise. That is, the digital speech signal hold circuits 511L, 511R each fetch the digital speech signal Dpcm during a time period unaffected by the power-source noise (a power-source noise nonoccurrence time period) before outputting the same.

The DAC 512L converts the digital speech signal outputted from the digital speech signal hold circuit 511L into an analog signal. The PWM signal generation circuit 513L controls a duty ratio of the switching pulse signal SP1 outputted on the basis of the analog signal outputted from the DAC 512L.

Similarly, the DAC 512R converts the digital speech signal outputted from the digital speech signal hold circuit 511R into an analog signal. The PWM signal generation circuit 513R controls a duty ratio of the switching pulse signal SP2 outputted on the basis of the analog signal outputted from the DAC 512R.

The drive circuit 521L outputs a drive pulse to respective gates of the PMOS transistor P2 and the NMOS transistor N2 according to the switching pulse signal SP1 outputted from the PWM signal generation circuit 513L. Similarly, the drive circuit drive circuit 521R outputs a drive pulse to respective gates of the PMOS transistor P3 and the NMOS transistor N3 according to the switching pulse signal SP2 outputted from the PWM signal generation circuit 513R.

The PMOS transistor P2 and the NMOS transistor N2 make up an inverter, and respective gates of the PMOS transistor P2 and the NMOS transistor N2 are coupled to the drive circuit 521L. Similarly, PMOS transistor P3 and the NMOS transistor N3 make up an inverter, and respective gates of the PMOS transistor P3 and the NMOS transistor N3 are coupled to the drive circuit 521R.

Upon the drive pulse being inputted to the respective gates of the PMOS transistor P2 and the NMOS transistor N2, the PMOS transistor P2 and the NMOS transistor N2 each complementarily repeat ON/OFF. By so doing, an output pulse signal is outputted from an output node to which the respective drains of the PMOS transistor P2 and the NMOS transistor N2 are coupled. This output pulse signal is outputted from the speech processing IC 500 via an output terminal TOL.

Similarly, upon the drive pulse being inputted to the respective gates of the PMOS transistor P3 and the NMOS transistor N3, the PMOS transistor P3 and the NMOS transistor N3 each complementarily repeat ON/OFF. By so doing, an output pulse signal is outputted from an output node to which the respective drains of the PMOS transistor P3 and the NMOS transistor N3 are coupled. This output pulse signal is outputted from the speech processing IC 500 via an output terminal TOR.

An end of the coil L1 is coupled to the output terminal TOL. The other end of the coil L1 is coupled to an end of the capacitor C1. The other end of the capacitor C1 is coupled to the ground (the ground voltage GND). The coil L1 and the capacitor C1 make up a LC filter, as described in the foregoing. A speaker 51L is coupled to a node between the coil L1 and the capacitor C1.

Similarly, an end of the coil L2 is coupled to the output terminal TOR. The other end of the coil L2 is coupled to an end of the capacitor C2. The other end of the capacitor C2 is coupled to the ground (the ground voltage GND). The coil L2 and the capacitor C2 make up a LC filter, as described in the foregoing. A speaker 51R is coupled to a node between the coil L2 and the capacitor C2.

By applying the circuit configuration shown in FIGS. 4, and so forth to the digital speech signal hold circuits 511L, 511R, respectively, it is possible to prevent a fetching error caused by the power-source noise from occurring to a digital signal, thereby providing a class-D amp excellent in throughput.

Sixth Embodiment

Figure 17:
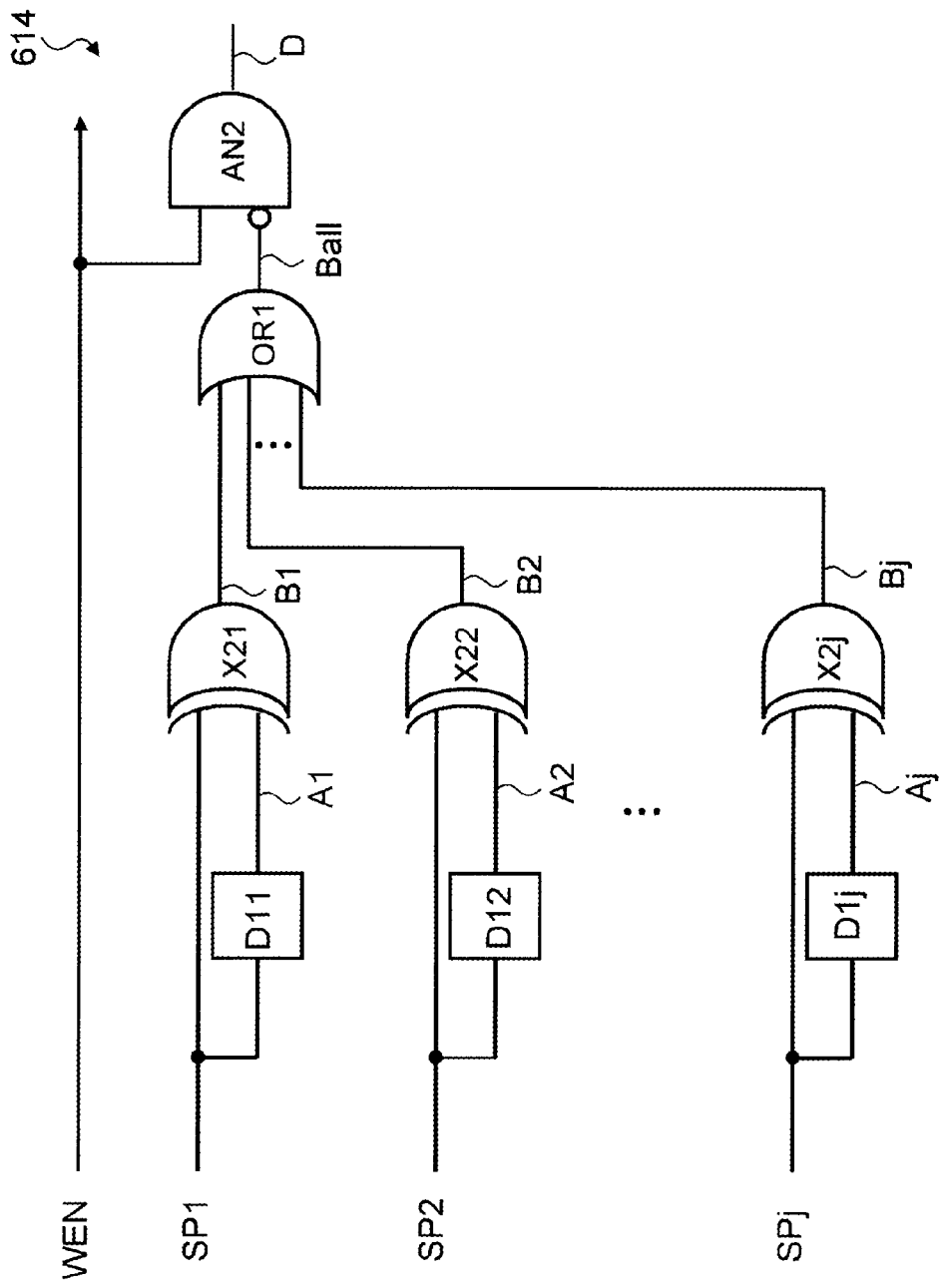
FIG. 17 is a circuit diagram of a mask signal generation circuit 614 according to a sixth embodiment of the invention.

Next, referring to FIG. 17, there is described a semiconductor device according to a sixth embodiment of the invention. FIG. 17 is a circuit diagram of a mask signal generation circuit 614 according to the sixth embodiment of the invention. The mask signal generation circuit 614 is capable of coping with the case where there exist j switching circuits. Accordingly, switching pulse signals SP1 to SPj are generated. The mask signal generation circuit 614 is provided with delay circuits D11 to D1j, XOR gates X21 to X2j, one OR gate OR1, and one AND gate AN2.

The switching pulse signal SP1 is fed back to one input of the XOR gates X21, and a signal A1 is inputted to the other input of the XOR gates X21, the signal A1 being the switching pulse signal SP1 that is delayed by the delay circuit D11.

The switching pulse signal SP2 is fed back to one input of the XOR gates X22, and a signal A2 is inputted to the other input of the XOR gates X22, the signal A2 being the switching pulse signal SP2 that is delayed by the delay circuit D12.

Thereafter, the switching pulse signal SPj is similarly fed back to one input of the XOR gates X2j, and a signal Aj is similarly inputted to the other input of the XOR gates X2j, the signal Aj being the switching pulse signal SPj that is delayed by the delay circuit D1j.

Respective signals B1 to Bj outputted from the XOR gates X21 to X2j are all inputted to the OR gate OR1. An inversion signal of a signal Ball outputted from the OR gate OR1 is inputted to one input of the AND gate AN2. A write enable signal WEN is inputted to the other input of the AND gate AN2.

Herein, the respective signals B1 to Bj outputted from the XOR gates X21 to X2j are signals that will be at H in a power-source noise occurrence time period of each of the j switching circuits. The signal Ball outputted from the OR gate OR1 is a signal that will be at H in a power-source noise occurrence time period for all the j switching circuits. With adoption of such a circuit configuration as described, fetching error caused by a power-source noise can be prevented from occurring to the digital signal even if a plurality of switching circuits are included, so that a semiconductor device excellent in throughput can be provided.

It is to be pointed out that the present invention can be applied to not only the DCDC converter and the class-D amp according to any of those embodiments described in the foregoing, but also all semiconductor devices provided with a switching circuit causing occurrence of a power-source noise. Further, the switching circuit may be provided with a function for automatically switching to a PFM control excelling in terms of power consumption at the time of a small load, while automatically switching to a PWM that is small in ripple and noise, and is excellent in conversion efficiency at the time of a medium or large load.

Having described the present invention with reference to those embodiments described in the foregoing, it is to be understood that the invention be not limited thereto, and that various modifications in configuration and details may occur to those skilled in the art without departing from the spirit and scope of the invention.

What is claimed is:

1. A semiconductor device comprising:
 a switching circuit that executes a switching operation by way of an output pulse signal according to a switching pulse control signal input to the switching circuit; and
 a digital signal hold circuit that operationally fetches a digital signal,
 wherein the pulse control signal is generated from output from the digital signal hold circuit,
 wherein the digital signal hold circuit receives the pulse control signal as input, and includes a mask signal generation circuit that generates a mask signal from the pulse control signal,
 wherein the digital signal hold circuit uses the mask signal to prevent the digital signal from being fetched by the digital signal hold circuit during a time period of power-source noise occurrence caused by the switching operation, and
 wherein the mask signal causes the digital signal hold circuit to delay fetching of the digital signal for a predetermined delay time period following a power-source noise occurrence corresponding to a switching operation of the switching circuit so that the digital signal is fetched during a time period of power-source noise non-occurrence.

2. The semiconductor device according to claim 1, wherein the mask signal generation circuit generates the mask signal from the pulse control signal and a delay signal is obtained by delaying the pulse control signal.

3. The semiconductor device according to claim 2, wherein the mask signal generation circuit includes an XOR gate where the pulse control signal and the delay signal are inputted.

4. The semiconductor device according to claim 1, further comprising:
 a pulse control signal generation circuit that generates the pulse control signal from the digital signal fetched by the digital signal hold circuit.

5. The semiconductor device according to claim 2, wherein a delay amount of the delay signal against the pulse control signal is variable.

6. The semiconductor device according to claim 1, wherein an operation of the mask signal generation circuit can be stopped.

7. The semiconductor device according to claim 1, wherein the pulse control signal is a PWM signal.

8. The semiconductor device according to claim 1, wherein the semiconductor device serves as a DCDC converter.

9. The semiconductor device according to claim 1, wherein the semiconductor device serves as a class-D amp.

10. A semiconductor device comprising:
- a microcomputer that generates a digital signal corresponding to an operation state of the microcomputer itself; and
- a DCDC converter that executes a switching operation corresponding to a pulse control signal, a duty ratio thereof being adjusted on the basis of the digital signal, thereby generating a voltage to be supplied to the microcomputer,
- wherein the DCDC converter includes a digital signal hold circuit that generates a digital output signal from which the pulse control signal is derived, and a mask signal generation circuit that generates a mask signal from the pulse control signal fed back into the DCDC converter, and
- wherein the DCDC converter applies the mask signal to cause the digital signal hold circuit to delay fetching of the digital signal for a predetermined delay time period so that the DCDC converter, on the basis of the pulse control signal, is prevented from fetching the digital signal during a time period of power-source noise occurrence caused by the switching operation so that fetching of the digital signal occurs during a time period of power-source noise nonoccurrence.

11. The semiconductor device according to claim 10, wherein the mask signal generation circuit generates the mask signal from the pulse control signal, and a delay signal for delaying fetching of the digital signal is obtained by delaying the pulse control signal.

12. The semiconductor device according to claim 11, wherein the mask signal generation circuit includes an XOR gate where the pulse control signal and the delay signal are inputted.

13. The semiconductor device according to claim 11, wherein a delay amount of the delay signal against the pulse control signal is variable.

14. The semiconductor device according to claim 10, wherein an operation of the mask signal generation circuit can be stopped.

15. The semiconductor device according to claim 10, wherein the pulse control signal is a PWM signal.

16. A method of fetching data of a semiconductor device provided with a switching circuit that executes a switching operation according to a pulse control signal, the method comprising:
- converting a digital output of a digital signal hold circuit into a pulse control signal, the digital output being generated on the basis of an input digital signal fetched by the digital signal hold circuit;
- at the digital signal hold circuit, generating a mask signal from the pulse control signal fed back as input to the digital signal hold circuit;
- at the digital signal hold circuit, using the mask signal to prevent a digital signal from being fetched as input for a predetermined time period thereby to prevent errors due to a power-source noise occurrence caused by the switching operation; and
- fetching the digital signal during a time period of power-source noise nonoccurrence after expiration of the predetermined time period in order to avoid fetching of the digital signal during a time period of power-source noise occurrence.

17. The method of fetching data according to claim 16, wherein the mask signal is generated from the pulse control signal, and a delay signal obtained by delaying the pulse control signal.

18. The method of fetching data according to claim 16, wherein the pulse control signal is generated from the digital signal that has been fetched.

19. The method of fetching data according to claim 16, wherein the pulse control signal is a PWM signal.

* * * * *